(12) United States Patent
Miyashita

(10) Patent No.: US 8,741,711 B2
(45) Date of Patent: Jun. 3, 2014

(54) MANUFACTURING METHOD OF A MOS TRANSISTOR USING A SIDEWALL SPACER

(75) Inventor: Toshihiko Miyashita, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 651 days.

(21) Appl. No.: 12/544,810

(22) Filed: Aug. 20, 2009

(65) Prior Publication Data

US 2010/0075476 A1    Mar. 25, 2010

(30) Foreign Application Priority Data

Sep. 22, 2008    (JP) .................................. 2008-243309

(51) Int. Cl.
*H01L 21/8238*    (2006.01)

(52) U.S. Cl.
USPC .................... 438/229; 438/230; 257/E21.334

(58) Field of Classification Search
CPC .............. H01L 21/823814; H01L 21/823842; H01L 29/6659; H01L 29/6653
USPC ............ 438/229–232; 257/E21.334, E21.641
See application file for complete search history.

(56) References Cited

U.S. PATENT DOCUMENTS

| | | | |
|---|---|---|---|
| 2002/0192868 A1* | 12/2002 | Kim ............................. | 438/112 |
| 2003/0148576 A1* | 8/2003 | Huang et al. .................. | 438/210 |
| 2004/0023478 A1* | 2/2004 | Samavedam et al. ......... | 438/592 |
| 2008/0315317 A1* | 12/2008 | Lai et al. ....................... | 257/369 |

FOREIGN PATENT DOCUMENTS

JP    2006-049781 A    2/2006

\* cited by examiner

*Primary Examiner* — Kimberly Rizkallah
*Assistant Examiner* — Duy T Nguyen
(74) *Attorney, Agent, or Firm* — Westerman, Hattori, Daniels & Adrian, LLP

(57) ABSTRACT

A method of manufacturing a semiconductor device which includes forming first and second gate patterns, forming first and second sidewall spacers on sidewalls of the first and second gate patterns respectively, implanting a first impurity into the semiconductor substrate, forming a third sidewall spacer on the first sidewall spacer and a fourth sidewall spacer on the second sidewall spacer in such a manner that the third sidewall spacer is in contact with the fourth sidewall spacer between the first and second gate patterns, implanting a second impurity into the semiconductor substrate, and removing the third and the fourth sidewall spacers.

5 Claims, 17 Drawing Sheets

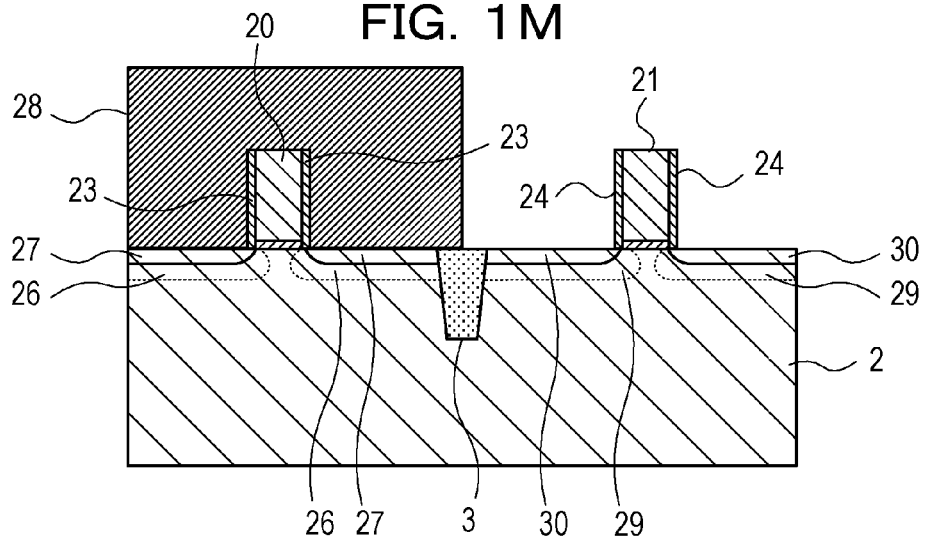
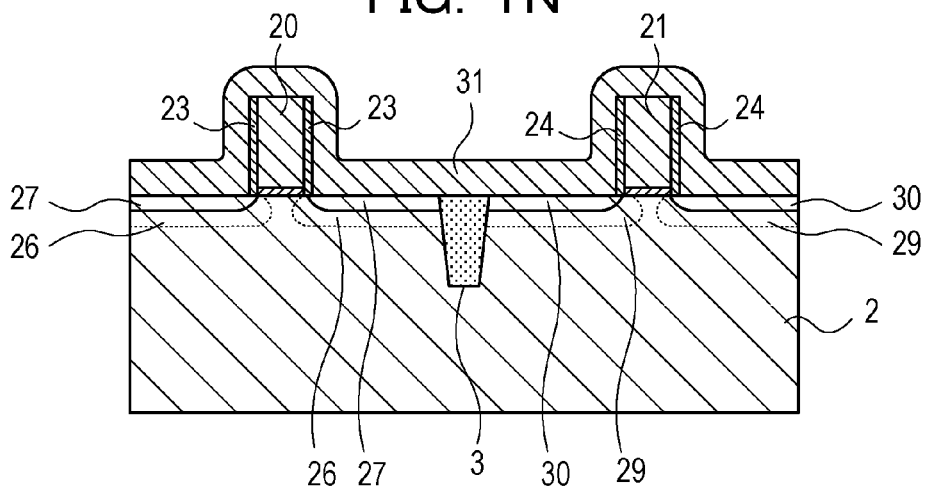
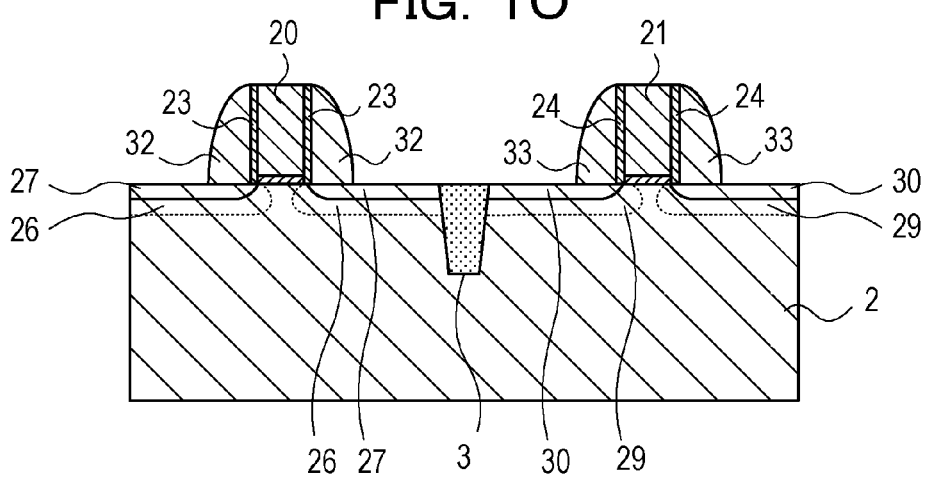

MANUFACTURING METHOD OF A MOS TRANSISTOR USING A SIDEWALL SPACER

CROSS-REFERENCE TO RELATED APPLICATIONS

This application is based upon and claims the benefit of priority from the prior Japanese Patent Application No. 2008-243309, filed on Sep. 22, 2008, the entire content of which is incorporated herein by reference.

FIELD

The present invention relate to a method of manufacturing a semiconductor device.

BACKGROUND

The development of the Complementary Metal-Oxide Semiconductor (CMOS) device technology has been supporting the electronics industry and engineers are adopting finer CMOS design rules at an unprecedented pace in order to further improve the performance. As for generations of CMOS devices, which are expressed in terms of technology node, volume production of the 45-nm node has been started, the 32-nm node technology has been developed, and development of the next generation or the 22-nm node has begun. The feature sizes of devices become smaller and smaller and the gate lengths of MOS transistors are now 35 nm or less.

As the feature size of devices becomes smaller, processes such as the photolithography and etching processes are becoming more difficult to perform. Source-drain impurity profiles are designed so that devices operate even when gate pitches are reduced. Sidewalls are used primarily to set an offset for regions such as source-drain regions to gate electrodes. It is known that a problem of variations in threshold voltage arises as the gate length of a MOS gate transistor decreases. The phenomenon is called the short-channel effect.

SUMMARY

According to an aspect of the invention, a method of manufacturing a semiconductor device includes forming a first and a second gate patterns, forming first and second sidewall spacers on sidewalls of the first and second gate patterns respectively, implanting a first impurity into the semiconductor substrate, forming a third sidewall spacer on the first sidewall spacer and a fourth sidewall spacer on the second sidewall spacer in such a manner that the third sidewall spacer is in contact with the fourth sidewall spacer between the first and second gate patterns, implanting a second impurity into the semiconductor substrate, and removing the third and the fourth sidewall spacers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
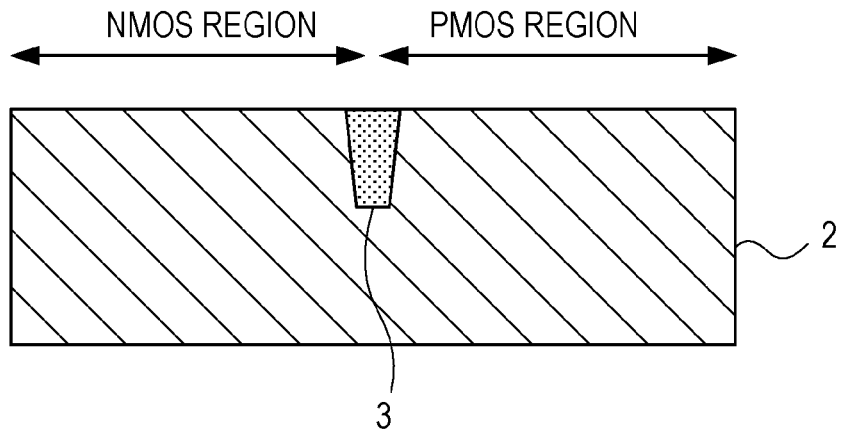
FIGS. 1A to 1Y are cross-sectional views illustrating a process for fabricating a semiconductor device according to an embodiment.
Figure 1B:
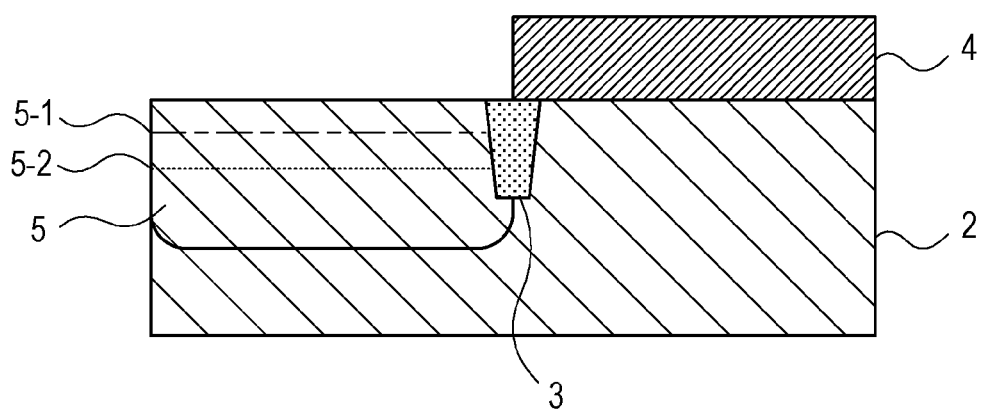
Figure 1C:
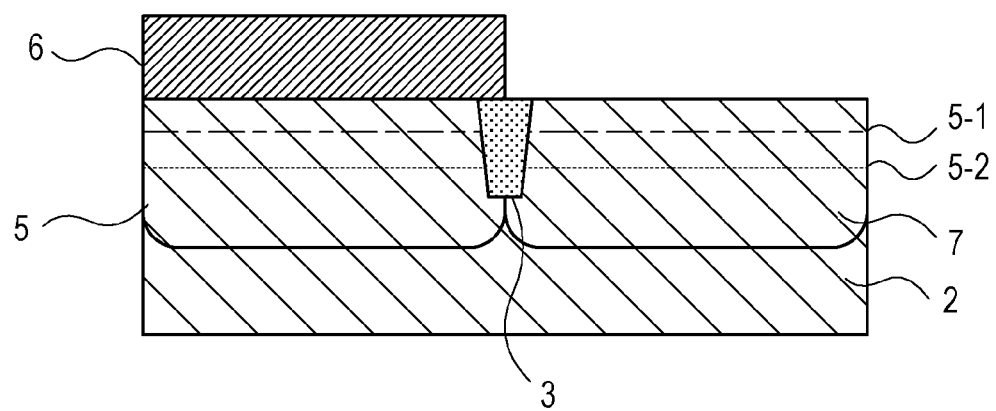
Figure 1D:
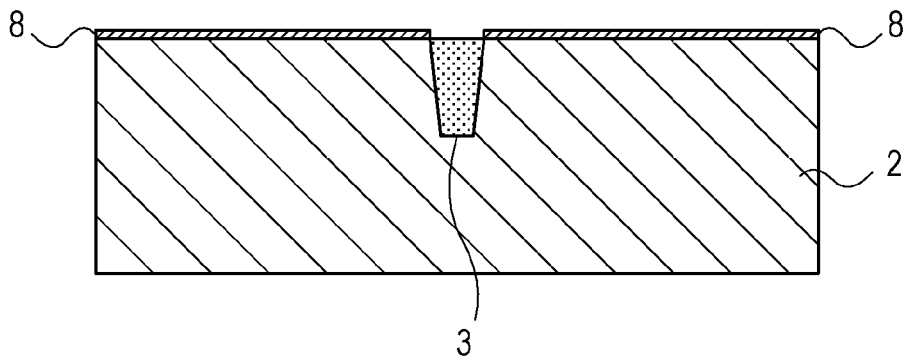
Figure 1E:
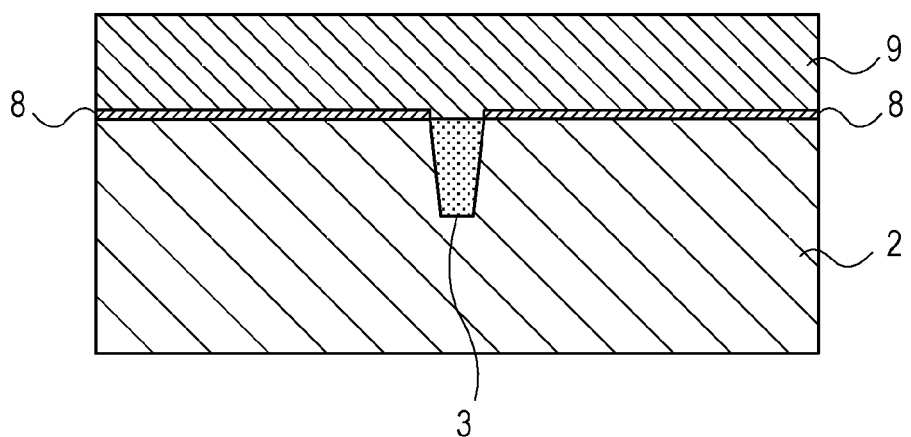
Figure 1F:
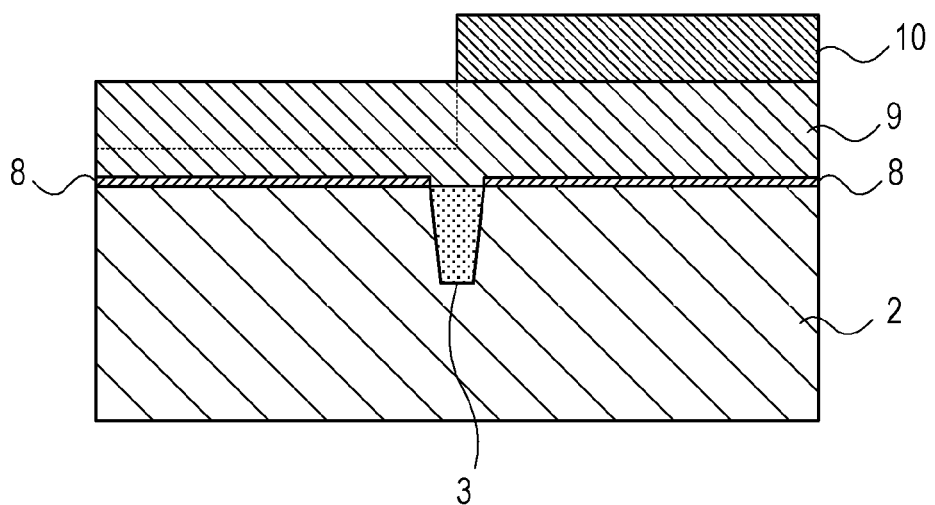
Figure 1G:
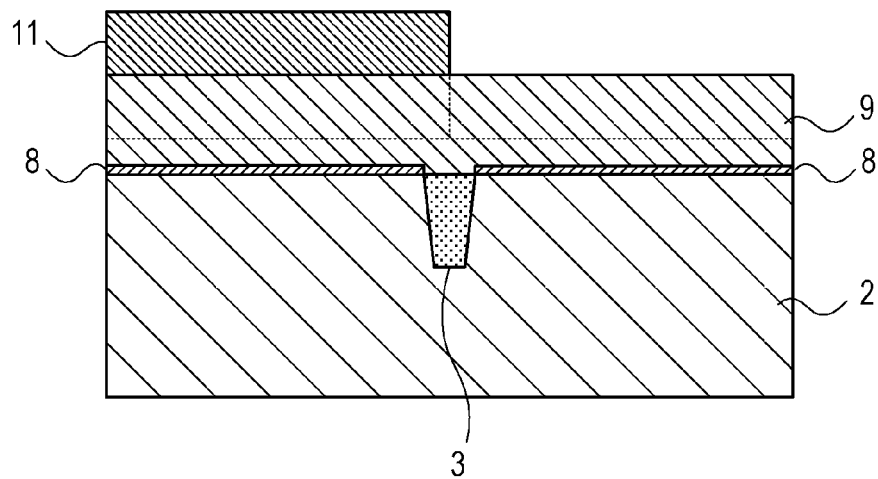
Figure 1H:
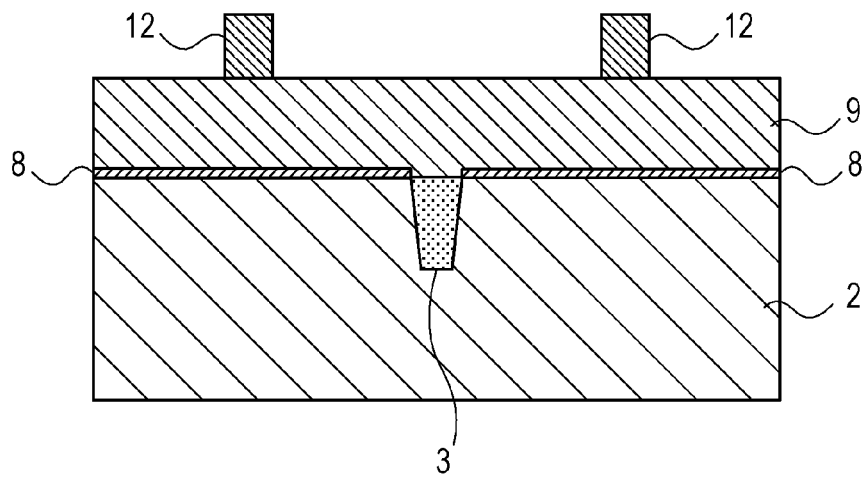
Figure 1I:
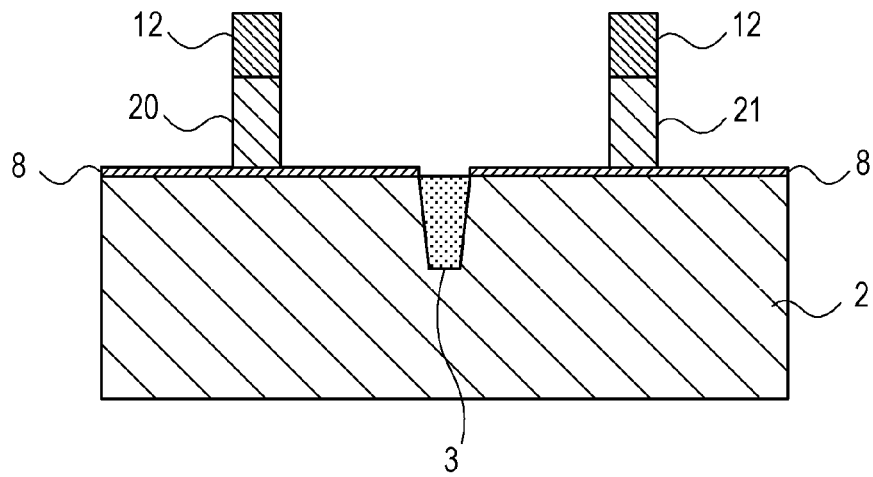
Figure 1J:
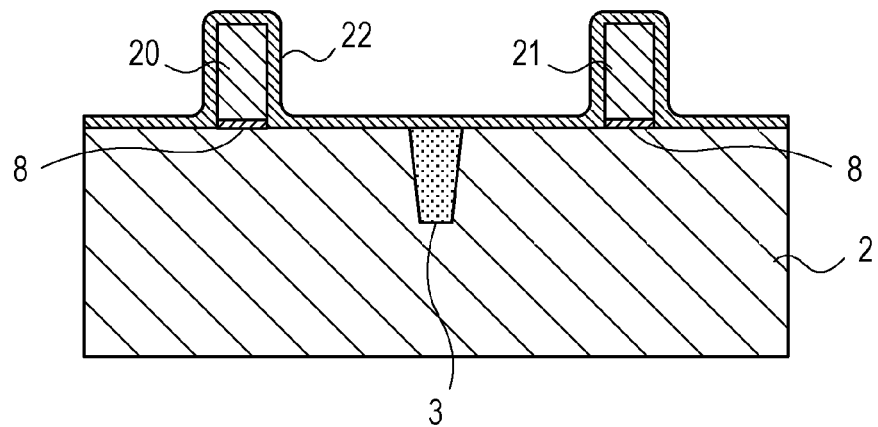
Figure 1K:
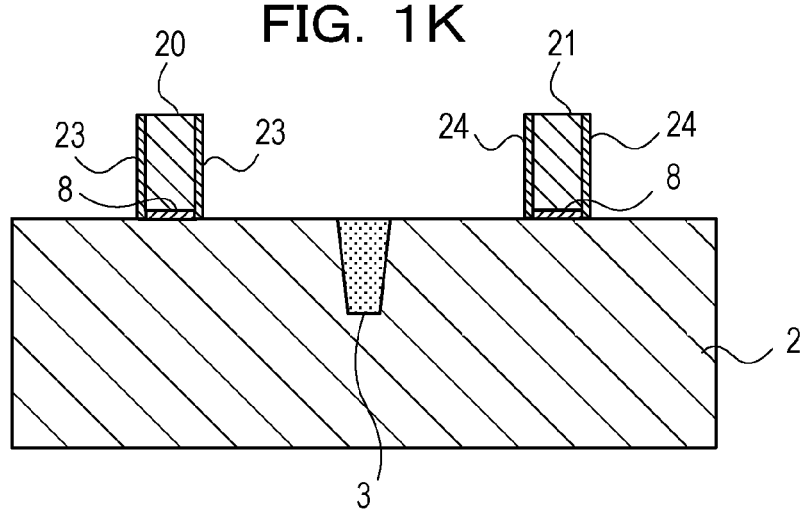
Figure 1L:
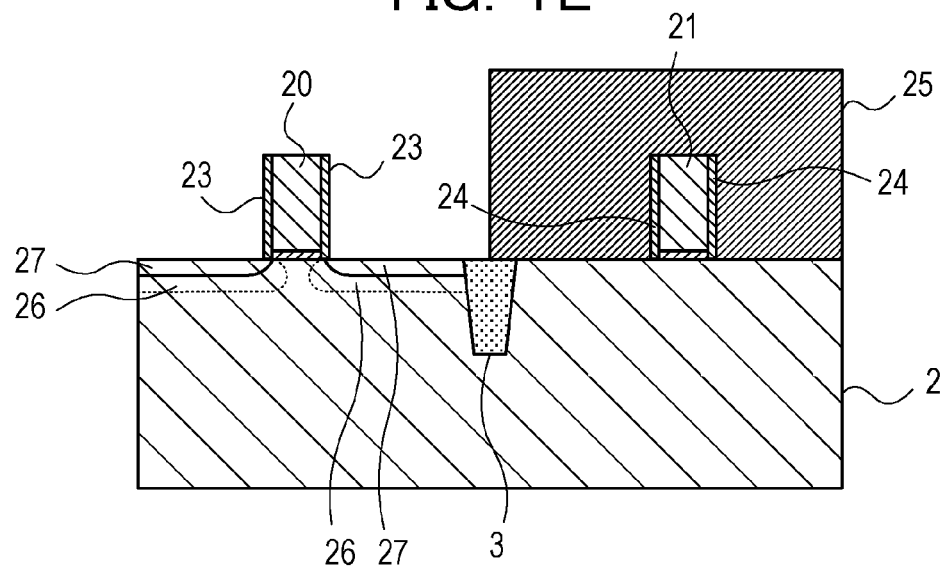
Figure 1P:
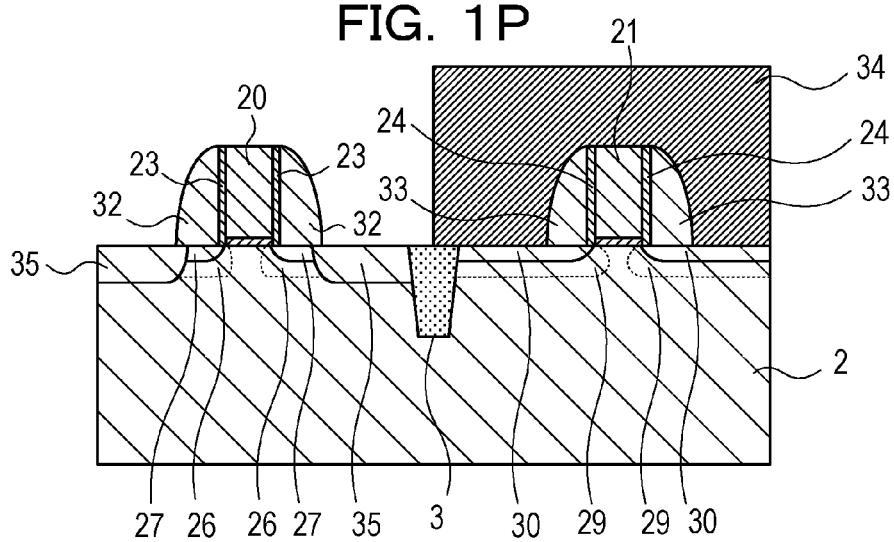
Figure 1Q:
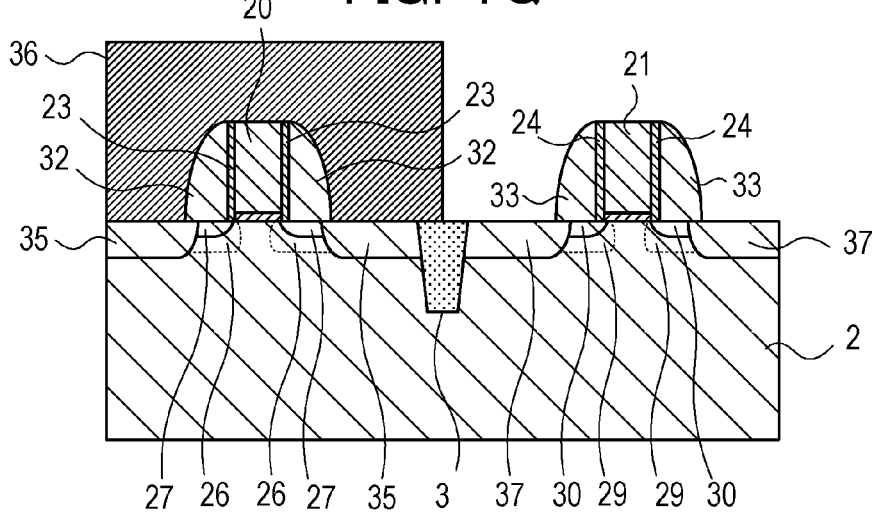
Figure 1R:
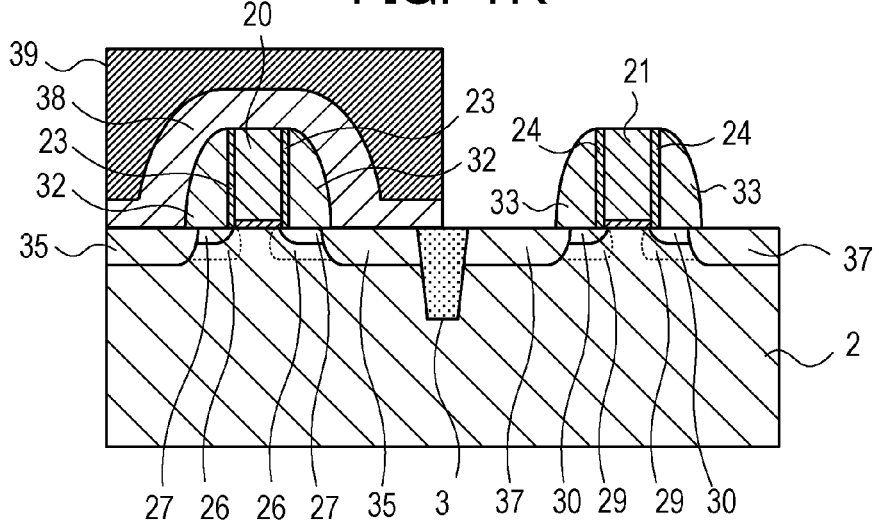
Figure 1S:
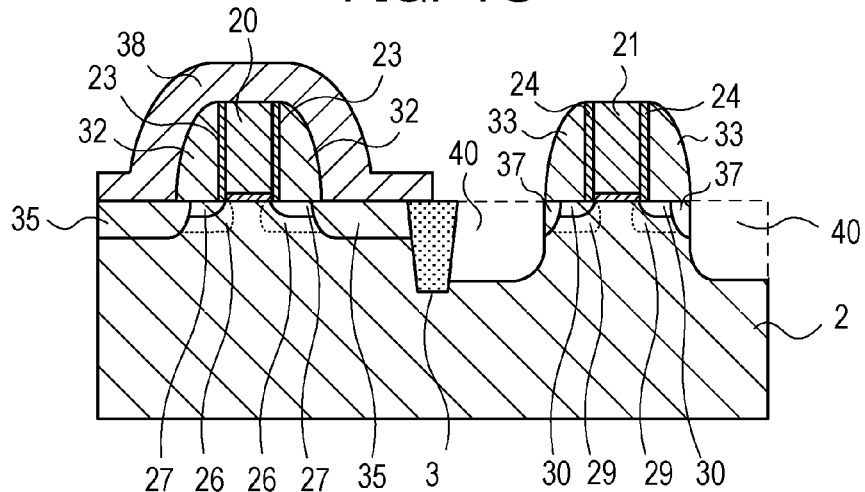
Figure 1T:
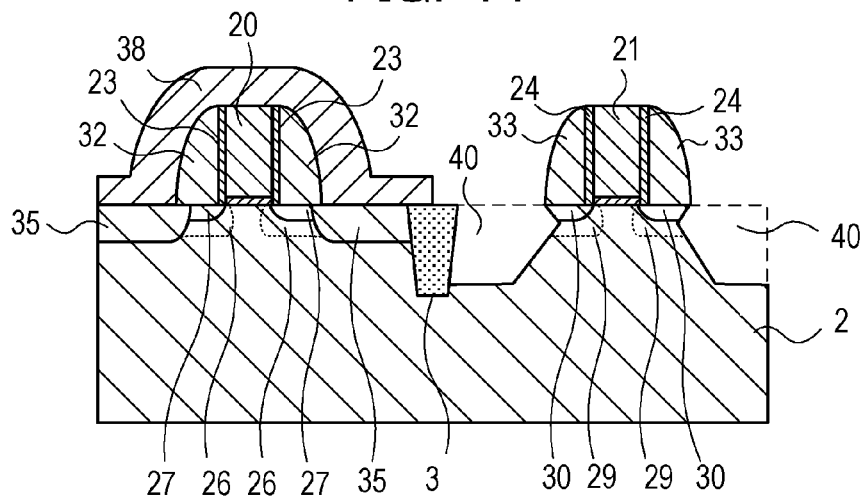
Figure 1U:
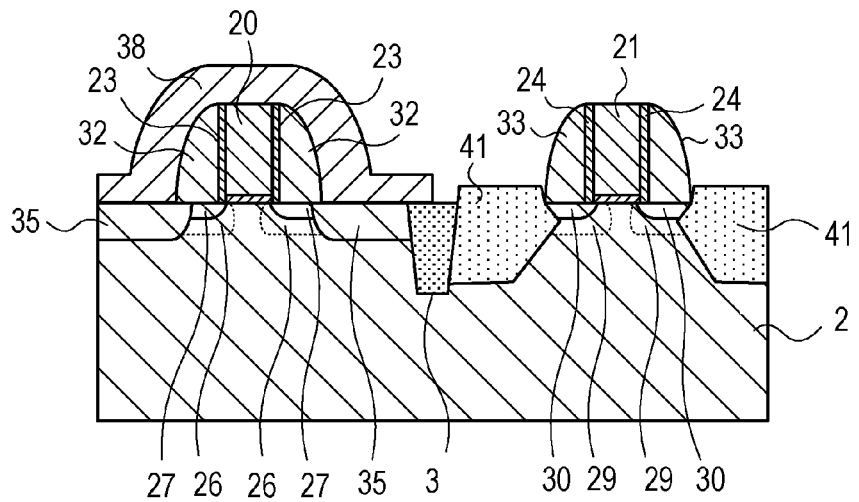
Figure 1V:
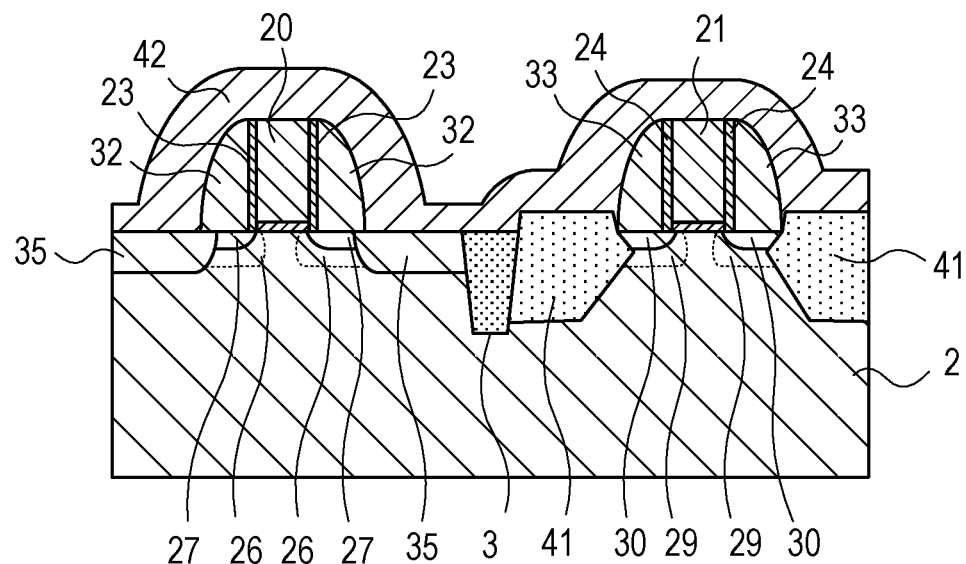
Figure 1W:
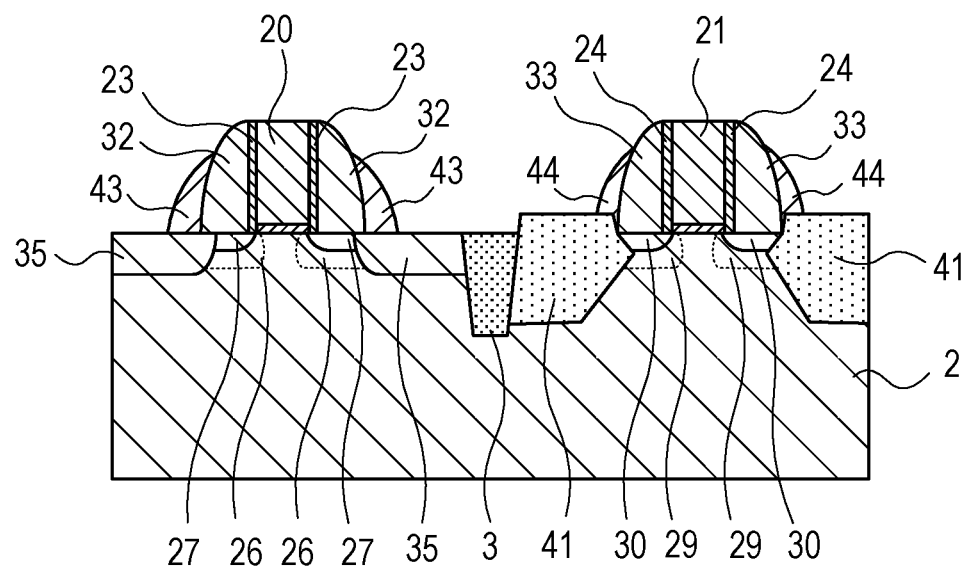
Figure 1X:
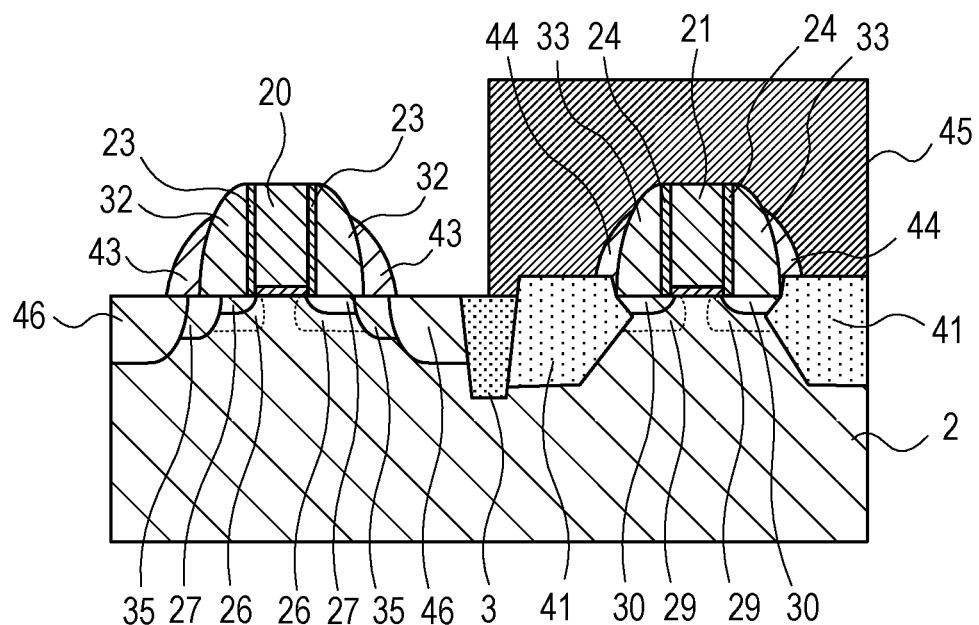
Figure 1Y:
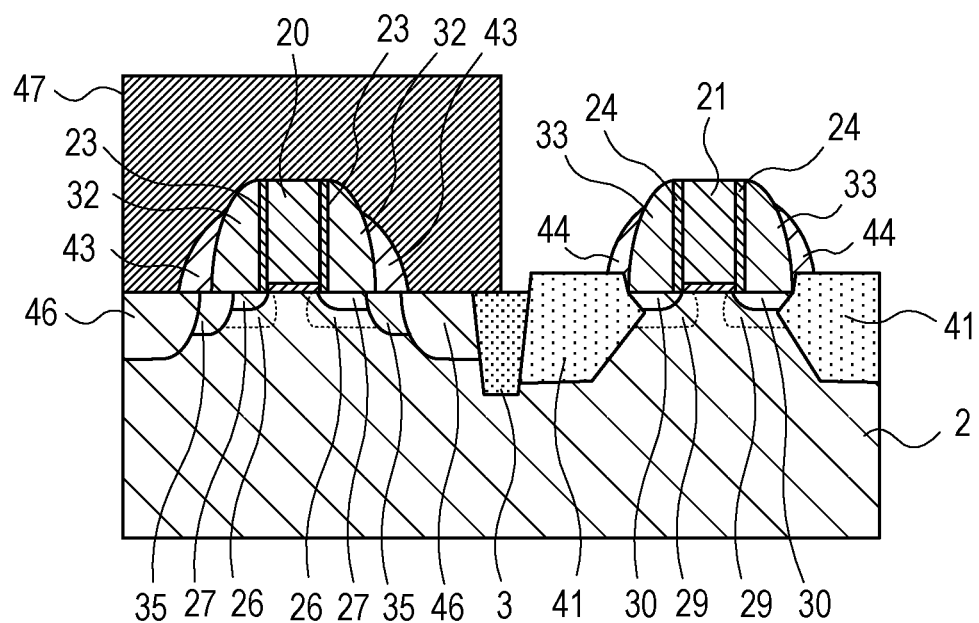

Referring to FIGS. 1A to 1Y, a semiconductor device fabrication method according to an embodiment will be described. In the semiconductor device fabrication method according to the present embodiment, an element isolation film 3 having a Shallow Trench Isolation (STI) structure is formed in a semiconductor substrate 2 as illustrated in FIG. 1A. For example, a resist pattern is formed over the semiconductor substrate 2 by photolithography and an element isolation trench is formed in the semiconductor substrate 2 by Reactive Ion Etching (RIE). The element isolation trench formed in the semiconductor substrate 2 is filled with silicon oxide film and a silicon oxide film is deposited over the semiconductor substrate 2 by a method such as Plasma Enhanced Chemical Vapor Deposition (PECVD).

The silicon oxide film over the semiconductor substrate 2 is planarized by Chemical Mechanical Polishing (CMP) to form an element isolation film 3 in the semiconductor substrate 2. The formation of the element isolation film 3 in the semiconductor substrate 2 defines a region where N-type MOS transistor is to be formed (hereinafter referred to as the NMOS region) and a region where a P-type MOS transistor is to be formed (hereinafter referred to as the PMOS region) in the semiconductor substrate 2.

Multiple NMOS and PMOS regions may be defined in the semiconductor substrate 2. In the present embodiment, an example will be described in which NMOS and PMOS regions adjacent to each other are defined in a semiconductor substrate 2. NMOS regions adjacent to each other may be defined in a semiconductor substrate 2. Also, PMOS regions adjacent to each other may be defined in a semiconductor substrate 2.

The embodiment will be described below in which NMOS transistors adjacent to each other are formed in a single active region of a semiconductor substrate 2.

A photoresist 4 is formed over a PMOS region of a semiconductor substrate 2 by photolithography as illustrated in FIG. 1B. The photoresist 4 is used as a mask to implant B (boron) ions with an acceleration energy of 100 keV and a dose in the range from $1\times10^{13}$ cm$^{-2}$ to $5\times10^{13}$ cm$^{-2}$ to form a P-well 5 in the NMOS region of the semiconductor substrate 2. Channel implantation is performed in the NMOS region of the semiconductor substrate 2 to form a channel region 5-1. B (boron), for example, is implanted into the NMOS region of the semiconductor substrate 2 by channel stop implantation with an acceleration energy in the range from 15 keV to 25 keV and a dose of $5\times10^{12}$ cm$^{-2}$ to form a channel stop region 5-2. In order to adjust the threshold value of the NMOS transistor, B (boron) ions, for example, are implanted into the NMOS region of the semiconductor substrate 2 with an acceleration energy of 10 keV and a dose in the range from $0.5 \times 10^{13}$ cm$^{-2}$ to $2 \times 10^{13}$ cm$^{-2}$.

Ashing or a wet process using an agent such as sulfuric acid hydrogen peroxidemixture (SPM) is performed to remove the photoresist 4 formed over the PMOS region of the semiconductor substrate 2. A photoresist 6 is formed over the NMOS region of the semiconductor substrate 2 by photolithography as illustrated in FIG. 1C. The photoresist 6 is used as a mask to implant P (phosphorus) ions into the PMOS region of the semiconductor substrate 2 with an acceleration energy in the range from 250 keV to 350 keV and a dose in the range from $1 \times 10^{13}$ cm$^{-2}$ to $5 \times 10^{13}$ cm$^{-2}$ to form an N-well 7 in the semiconductor substrate 2. As (arsenic), for example, is implanted into the PMOS region 2 of the semiconductor substrate 2 by channel stop implantation with an acceleration energy in the range from 100 keV to 150 keV to form a channel stop region 5-2 and a dose in the range from $1 \times 10^{12}$ cm$^{-2}$ to $5 \times 10^{12}$ cm$^{-2}$. In order to adjust the threshold value of the PMOS transistor, As (arsenic) ions, for example, are implanted into the PMOS region of the semiconductor substrate 2 with an acceleration energy in the range from 50 keV to 100 keV and a dose in the range from $0.5 \times 10^{13}$ cm$^{-2}$ to $2 \times 10^{13}$ cm$^{-2}$ to form a channel region 5-1.

Ashing or a wet process using an agent such as SPM is performed to remove the photoresist 6 formed over the NMOS region of the semiconductor substrate 2. In order to activate impurities such as B (boron), P (phosphorus), and As (arsenic) implanted in the semiconductor substrate 2, annealing is applied to the semiconductor substrate 2 at a heat treatment temperature of 1000° C. for a treatment time of 10 seconds, for example.

A gate insulating film 8 is formed over the semiconductor substrate 2 as shown in FIG. 1D. For example, dry oxidization is performed at approximately 900° C. to form a foundation oxide film with a thickness of approximately 1 nm over the semiconductor substrate 2. Then, plasma nitridation is performed in an atmosphere of NO to form an oxinitride film, which is a gate insulating film 8, on the semiconductor substrate 2. The plasma nitridation may be performed in an atmosphere of $N_2O$ or $NH_3$, instead of an atmosphere of NO. The gate oxide film 8 is not limited to an oxinitride film; the gate oxide film 8 may be a high-dielectric-constant (High-k) insulating film. The P-well 5 and the N-well 7 are not illustrated in FIG. 1D and the subsequent figures.

A gate polysilicon 9 is deposited over the gate oxide film 8 to a thickness of approximately 100 nm by a method such as Low Pressure Chemical Vapor Deposition (LPCVD) at 600° C., for example, as illustrated in FIG. 1E. A photoresist 10 is formed over the gate polysilicon 9 in the PMOS region by photolithography as illustrated in FIG. 1F. The photoresist 10 is used as a mask to implant n-type impurity ions into the gate polysilicon 9 in the NMOS region. For example, As (arsenic) ions may be implanted into the gate polysilicon 9 in the NMOS region with an acceleration energy in the range from 20 keV to 30 keV and a dose in the range from $3 \times 10^{15}$ cm$^{-2}$ to $5 \times 10^{15}$ cm$^{-2}$.

The photoresist 10 is removed by ashing or a wet process using an agent such as SPM. A photoresist 11 is formed over the gate polysilicon 9 in the NMOS region by photolithography as illustrated in FIG. 1G. The photoresist 11 is used as a mask to implant p-type impurity ions into the gate polysilicon 9 in the PMOS region. For example, B (boron) ions may be implanted into the gate polysilicon 9 in the PMOS region with an acceleration energy in the range from 3 keV to 5 keV and a dose of $3 \times 10^{15}$ cm$^{-2}$ to $5 \times 10^{15}$ cm$^{-2}$.

The photoresist 11 is removed by ashing or a wet process using an agent such as SPM. In order to accelerate diffusion of the n-type and p-type impurities implanted in the gate polysilicon 9 as required, spike annealing may be applied to the semiconductor substrate 2 at a heat treatment temperature of 1000° C. for a treatment time of approximately 5 seconds, for example.

As illustrated in FIG. 1H, a photoresist 12 is formed over the gate polysilicon 9 by photolithography. An anti-reflection coating may be formed over the gate polysilicon 9 as required. If an anti-reflection coating is formed over the gate polysilicon 9, the photoresist 12 is formed over the anti-reflection coating.

The photoresist 12 is used as a mask to anisotropically etch the gate polysilicon 9 by RIE to form gate patterns 20 and 21 as illustrated in FIG. 1I. The gate patterns 20 and 21 are formed adjacent to each other as illustrated in FIG. 1I. The photoresist 12 formed over the gate patterns 20 and 21 are removed by ashing or a wet process using an agent such as SPM.

As illustrated in FIG. 1J, an insulating film 22 is formed over the entire NMOS and PMOS regions of the semiconductor substrate 2. For example, a $SiO_2$ film is deposited by LPCVD, for example, from Tetra Ethyl Ortho Silicate (TEOS) over the semiconductor substrate 2 to a thickness of 10 nm, for example, at 600° C., for example. For example, a SiN film may be deposited over the semiconductor substrate 2 from dichlorsilane ($SiH_2Cl_2$) to a thickness of 10 nm by LPCVD at 650° C., for example.

Overall anisotropic etch back is applied to the insulating film 22 by RIE to form sidewall spacers 23 and 24 as illustrated in FIG. 1K. That is, the sidewall film 22 is left on the sidewalls of the gate pattern 20 to form a sidewall spacer 23 and the sidewall film 22 is left on the sidewalls of the gate pattern 21 to form a sidewall spacer 24. The sidewall film 22 and the sidewall spacers 23 and 24 are not essential to the present embodiment.

A photoresist 25 is formed over the PMOS region of the semiconductor substrate 2 by photolithography. As illustrated in FIG. 1L, the gate pattern 20, the sidewall spacer 23, and the photoresist 25 are used as a mask to apply pocket implantation and extension implantation to the NMOS region of the semiconductor substrate 2. Here, co-implantation of N (nitrogen) or Ge (germanium) may be used. In this way, the sidewall spacer 23 functions as an offset film for the pocket implantation and extension implantation in the NMOS region of the semiconductor substrate 2. If the step of forming the sidewall spacer 23 has been omitted, the gate pattern 20 and the photoresist 25 are used as a mask to apply the pocket implantation and extension implantation to the NMOS region of the semiconductor substrate 2.

The pocket implantation into the NMOS region of the semiconductor substrate 2 is accomplished by implanting a pocket impurity into the NMOS region of the semiconductor substrate 2. The pocket impurity to be implanted into the NMOS region of the semiconductor substrate 2 is a p-type impurity such as B (boron) or In (indium). For example, B (boron) ions may be implanted into the NMOS region of the semiconductor substrate 2 with an acceleration energy in the range from 3 keV to 6 keV at a tilt angle in the range from 20 degrees to 30 degrees, with a doze in the range from $0.4 \times 10^{-}$ cm$^{-2}$ to $1 \times 10^{13}$ cm$^{-2}$ in four directions.

The extension implantation into the NMOS region of the semiconductor substrate 2 is accomplished by implanting an extension impurity into the NMOS region of the semiconductor substrate 2. The extension impurity to be implanted into the NMOS region of the semiconductor substrate 2 is an n-type impurity such as P (phosphorus) or As (arsenic). For example, As (arsenic) ions may be implanted into the NMOS region of the semiconductor substrate 2 with an acceleration energy in the range from 1 kev to 3 kev and a dose in the range from $1.0 \times 10^{15}$ cm$^{-2}$ to $2 \times 10^{15}$ cm$^{-2}$, for example.

The pocket impurity implantation into the NMOS region of the semiconductor substrate 2 forms a pocket region 26 in the NMOS region of the semiconductor substrate 2 as illustrated in FIG. 1L. The extension impurity implantation into the NMOS region of the semiconductor substrate 2 forms an extension region 27 in the NMOS region of the semiconductor substrate 2 as illustrated in FIG. 1L. The pocket impurity is implanted deeper than the extension impurity implanted in the NMOS region of the semiconductor substrate 2.

Ashing or a wet process using an agent such as SPM is performed to remove the photoresist 25 formed over the PMOS region of the semiconductor substrate 2. Pocket implantation and extension implantation into different NMOS regions of the semiconductor substrate 2 may be performed under different conditions. In that case, the steps of forming the photoresist 25, performing pocket implantation into an NMOS region of the semiconductor substrate 2, performing extension implantation into the NMOS region of the semiconductor substrate 2, and removing the photoresist 25 are repeated as many times as required.

A photoresist 28 is formed over the NMOS region of the semiconductor substrate 2 by photolithography. As illustrated in FIG. 1M, the gate pattern 21, sidewall spacer 24, and the photoresist 28 are used as a mask to apply pocket implantation and extension implantation to the PMOS region of the semiconductor substrate 2. Here, co-implantation of a material such as C (carbon) or Ge (germanium) may be used. In this way, the sidewall spacer 24 functions as an offset for performing pocket implantation and extension implantation into the PMOS region of the semiconductor substrate 2. If the step of forming the sidewall spacer 24 has been omitted, the gate pattern 21 and the photoresist 28 are used as a mask to perform the pocket implantation and extension implantation into the PMOS region of the semiconductor substrate 2.

The pocket implantation into the PMOS region of the semiconductor substrate 2 is accomplished by implanting a pocket impurity into the PMOS region of the semiconductor substrate 2. The pocket impurity to be implanted into the PMOS region of the semiconductor substrate 2 is an n-type impurity such as As (arsenic) or Sb (antimony). For example, As (arsenic) ions may be implanted into the PMOS region of the semiconductor substrate 2 with an acceleration energy in the range from 25 keV to 40 keV at a tilt angle in the range from 20 degrees to 30 degrees with a dose in the range from $0.4 \times 10^{13}$ cm$^{-2}$ to $1 \times 10^{13}$ cm$^{-2}$ in four directions.

The extension implantation into the PMOS region of the semiconductor substrate 2 is accomplished by implanting an extension impurity into the PMOS region of the semiconductor substrate 2. The extension impurity to be implanted into the PMOS region of the semiconductor substrate 2 is a p-type impurity such as boron (B). For example, B (boron) ions may be implanted into the PMOS region of the semiconductor substrate 2 with an acceleration energy of 0.5 keV with a dose in the range from $1.0 \times 10^{15}$ cm$^{-2}$ to $2 \times 10^{15}$ cm$^{-2}$.

The implantation of pocket impurity into the PMOS region of the semiconductor substrate 2 forms a pocket region 29 in the PMOS region of the semiconductor substrate 2 as illustrated in FIG. 1M. The implantation of extension impurity into the PMOS region of the semiconductor substrate 2 forms an extension region 30 in the PMOS region of the semiconductor substrate 2 as illustrated in FIG. 1M. The pocket impurity ions are implanted into the PMOS region of the semiconductor substrate 2 deeper than the extension impurity implanted in the PMOS region of the semiconductor substrate 2.

Ashing or a wet process using an agent such as SPM is performed to remove the photoresist 28 formed over the NMOS region of the semiconductor substrate 2. Pocket implantation and extension implantation into different PMOS regions of the semiconductor substrate 2 may be performed under different conditions. In this case, the steps of forming photoresist 28, performing pocket implantation into the PMOS regions of the semiconductor substrate 2, performing extension implantation into the PMOS regions of the semiconductor substrate 2, and removing the photoresist 28 are repeated as many times as required.

An insulating film 31 is formed to cover the semiconductor substrate 2, the gate patterns 20, 21, and the sidewall spacers 23, 24 as illustrated in FIG. 1N. That is, the sidewall film 31 is formed over the entire NMOS and PMOS regions of the semiconductor substrate 2. For example, a SiON film may be deposited over the semiconductor substrate 2 to a thickness in the range from 20 nm to 40 nm by LPCVD at a low temperature of less than or equal to approximately 600° C. to form the insulating film 31. If the step of forming the sidewall spacers 23 and 24 has been omitted, the insulating film 31 is formed to cover the semiconductor substrate 2 and the gate patterns 20 and 21. The insulating film 31 may be exposed to an HF solution in a subsequent process step. The insulating film 31 may be made of SiN because SiN is highly resistant to solutions such as an HF solution.

As illustrated in FIG. 1O, overall anisotropic etch back is applied to the insulating film 31 by RIE to form sidewall spacers 32 and 33.

A photoresist 34 is formed over the PMOS region of the semiconductor substrate 2 by photolithography. As illustrated in FIG. 1P, the gate pattern 20, the sidewall spacers 23, 32, and the photoresist 34 are used as a mask to perform buffer implantation into the NMOS region of the semiconductor substrate 2. In this way, the sidewall spacer 32 functions as an offset film for buffer implantation into the NMOS region of the semiconductor substrate 2. If the step of forming the sidewall spacer 23 has been omitted, the gate pattern 20, the sidewall spacer 32, and the photoresist 34 are used as a mask to perform buffer implantation into the NMOS region of the semiconductor substrate 2.

The buffer implantation into the NMOS region of the semiconductor substrate 2 is accomplished by implanting a buffer impurity into the NMOS region of the semiconductor substrate 2. The buffer impurity to be implanted into the NMOS region of the semiconductor substrate 2 is an n-type impurity such as As (arsenic). For example, As (arsenic) ions may be implanted into the NMOS region of the semiconductor substrate 2 with an acceleration energy of 10 keV to 15 keV and a dose in the range from $1 \times 10^{15}$ cm$^{-2}$ to $5 \times 10^{15}$ cm$^{-2}$.

The buffer impurity implantation into the NMOS region of the semiconductor substrate 2 forms a buffer region 35 in the NMOS region of the semiconductor substrate 2 as illustrated in FIG. 1P. The buffer impurity is implanted into the NMOS region of the semiconductor substrate 2 deeper than the extension impurity implanted in the NMOS region of the semiconductor substrate 2.

Ashing or a wet process using an agent such as SPM is performed to remove the photoresist 34 formed over the PMOS region of the semiconductor substrate 2. Then, a photoresist 36 is formed over the NMOS region of the semiconductor substrate 2 by photolithography. The gate pattern 21, the sidewall spacers 24 and 33, and the photoresist 36 are used as a mask to perform buffer implantation into the PMOS region of the semiconductor substrate 2. In this way, the sidewall spacer 33 functions as an offset film for buffer implantation into the PMOS region of the semiconductor substrate 2. If the step of forming the sidewall spacer 24 has been omitted, the gate pattern 21, sidewall spacer 33, and the photoresist 36 are used as a mask to perform buffer implantation into the PMOS region of the semiconductor substrate 2.

The buffer implantation into the PMOS region of the semiconductor substrate 2 is accomplished by implanting a buffer impurity into the PMOS region of the semiconductor substrate 2. The buffer impurity to be implanted into the PMOS region of the semiconductor substrate 2 is a p-type impurity such as B (boron). For example, B (boron) ions may be implanted into the PMOS region of the semiconductor substrate 2 with an acceleration energy in the range from 10 keV to 15 keV and a dose in the range from $1\times10^{15}$ cm$^{-2}$ to $5\times10^{15}$ cm$^{-2}$.

The buffer impurity implantation into the PMOS region of the semiconductor substrate 2 forms a buffer region 37 in the PMOS region of the semiconductor substrate 2 as illustrated in FIG. 1Q. The buffer impurity is implanted into the PMOS region of the semiconductor substrate 2 deeper than the extension impurity implanted in the PMOS region of the semiconductor substrate 2.

Ashing or a wet process using an agent such as SPM is performed to remove the photoresist 36 formed over the NMOS region of the semiconductor substrate 2. A cap film 38 is formed over the entire NMOS and PMOS regions of the semiconductor substrate 2. For example, a SiO$_2$ film may be deposited by LPCVD over the semiconductor substrate 2 to a thickness of 50 nm at a low temperature lower than or equal to 550° C. to form the cap film 38. If the step of forming the sidewall spacers 23 and 24 has been omitted, the cap film 38 is formed to cover the semiconductor substrate 2, the gate patterns 20, 21, and the sidewall spacers 32 and 33.

A photoresist 39 is formed over the NMOS region of the semiconductor substrate 2 by photolithography. As illustrated in FIG. 1R, the photoresist 39 is used as a mask to perform anisotropic etching of the cap film 38 in the PMOS region of the semiconductor substrate 2 by RIE to remove the cap film 38 from the PMOS region of the semiconductor substrate 2. In this way, the photoresist 39 formed over the NMOS region of the semiconductor substrate 2 functions as a mask in removing the cap film 38 in the PMOS region of the semiconductor substrate 2. The photoresist 39 may be selectively formed over multiple NMOS regions of the semiconductor substrate 2. With this, the cap film 38 may be selectively removed from the multiple NMOS regions of the semiconductor substrate 2.

Ashing or a wet process using an agent such as SPM is performed to remove the photoresist 39 formed over the NMOS region of the semiconductor substrate 2. As illustrated in FIG. 1S, the gate pattern 21, the sidewall spacers 24 and 33, and the cap film 38 are used as a mask to perform anisotropic etching of the PMOS region of the semiconductor substrate 2 by RIE to form a trench 40 in the PMOS region of the semiconductor substrate 2.

As illustrated in FIG. 1T, the trench 40 formed in the PMOS region of the semiconductor substrate 2 is horizontally extended by wet etching. That is, the trench 40 formed in the PMOS region of the semiconductor substrate 2 is processed by wet etching so that the sidewall of the trench 40 is shaped like a letter Σ. The trench 40 formed in the PMOS region of the semiconductor substrate 2 is shaped in this way in order to efficiently apply a strain to the channel in the PMOS region of the semiconductor substrate 2. The shaping of the trench 40 formed in the PMOS region of the semiconductor substrate 2 may be performed as required. Therefore the step of shaping of the trench 40 formed in the PMOS region of the semiconductor substrate 2 may be omitted.

SiGe (silicon germanium) is selectively epitaxially grown in the trench 40 formed in the PMOS region of the semiconductor substrate 2. By epitaxially growing SiGe in the trench 40 formed in the PMOS region of the semiconductor substrate 2, a SiGe layer 41 is formed in the PMOS region of the semiconductor substrate 2 as illustrated in FIG. 1U. During the epitaxial growth of SiGe, the PMOS region of the semiconductor substrate 2 may be in situ doped with B (boron). If the PMOS region of the semiconductor substrate 2 is in-situ doped with B (boron) in the silicon germanium layer 41 forming process, the step of performing buffer implantation into the PMOS region of the semiconductor substrate 2 may be omitted.

Because the lattice constant of $Si_{1-x}Ge_x$ (x=0.1 to 0.3) is greater than that of Si, a compressive strain is caused in the depth direction and a tensile strain is cased in the horizontal direction. As a result, the compressive strain is applied along the channel direction, which increases the hole mobility. The width of the sidewall spacer 33 is set so that a desired distance between the silicon germanium layer 41 and the channel is provided. In order to suppress the growth of SiGe on the gate pattern 21, an insulating film of a material such as SiO$_2$ may be formed over the gate pattern 21 before SiGe is epitaxially grown.

By a wet process using an HF solution, the cap film 38 is removed from the PMOS region of the semiconductor substrate 2. An insulating film 42 is formed over the entire NMOS and PMOS regions of the semiconductor substrate 2 as illustrated in FIG. 1V. For example, a SiO$_2$ film may be deposited over the semiconductor substrate 2 by LPCVD at a temperature equal to or less than 550° C. to a thickness of 50 nm to form the insulating film 42. If the step of forming the sidewall spacers 23 and 24 has been omitted, the insulating film 42 is formed to cover the semiconductor substrate 2, gate patterns 20, 21, and the sidewall spacers 32, 33. Because the insulating film 42 is removed in a subsequent process step, the sidewall film 42 is preferably formed of SiO$_2$ film, which may be removed with an HF solution.

As illustrated in FIG. 1W, overall anisotropic etch back is applied to the insulating film 42 by RIE to form sidewall spacers 43 and 44.

A photoresist 45 is formed in the PMOS region over the semiconductor substrate 2 by photolithography. As illustrated in FIG. 1X, the gate pattern 20, the sidewall spacers 23, 32, 43, and the photoresist 45 are used as a mask to perform deep-source-drain (SD) impurity implantation into the NMOS region of the semiconductor substrate 2. In this way, the sidewall spacer 43 functions as an offset film in deep-SD impurity implantation into the NMOS region of the semiconductor substrate 2. If the step of forming the sidewall spacer 23 has been omitted, the gate pattern 20, the sidewall spacers 32 and 43, and the photoresist 45 are used as a mask to perform the deep-SD impurity implantation into the NMOS region of the semiconductor substrate 2. The distance between the deep-SD region 46 and the end of the gate pattern 20 may be controlled by the widths of the sidewall spacers 43, 23 and 32. In the present embodiment, an offset between the deep-SD region 46 and the end of the gate pattern 20 in the NMOS region may be set by the provision of the sidewall spacer 43, independently of an offset between the silicon germanium layer 41 and a channel region in the PMOS region.

The deep-SD impurity implantation into the NMOS region of the semiconductor substrate 2 is accomplished by implanting a deep-SD impurity into the NMOS region of the semiconductor substrate 2. The deep-SD impurity to be implanted into the NMOS region of the semiconductor substrate 2 is an n-type impurity such as P (phosphorus). For example, P (phosphorus) ions may be implanted into the NMOS region of the semiconductor substrate 2 with an acceleration energy in the range from 5 keV to 10 keV and a dose in the range from $1\times10^{15}$ cm$^{-2}$ to $5\times10^{15}$ cm$^{-2}$.

The deep-SD impurity implantation into the NMOS region of the semiconductor substrate 2 forms the deep-SD region 46 in the NMOS region of the semiconductor substrate 2 as illustrated in FIG. 1X. Since the deep-SD impurity is implanted into the NMOS region of the semiconductor substrate 2 deeper than the extension impurity implanted in the NMOS region of the semiconductor substrate 2, the deep-SD region 46 extends to a depth deeper than the extension region 27. In other words, since the extension impurity is implanted into the NMOS region of the semiconductor substrate 2 shallower than the deep-SD impurity implanted in the NMOS region of the semiconductor substrate 2, the extension region 27 is formed to a depth shallower than the deep-SD region 46.

Since the deep-SD impurity is implanted into the NMOS region of the semiconductor substrate 2 deeper than the buffer impurity implanted in the NMOS region of the semiconductor substrate 2, the deep-SD region 46 extends to a depth deeper than the buffer region 35. In other words, since the buffer impurity is implanted into the NMOS region of the semiconductor substrate 2 shallower than the deep-SD impurity implanted in the NMOS region of the semiconductor substrate 2, the buffer region 35 is formed to a depth shallower than the deep-SD region 46.

A photoresist 47 is formed over the NMOS region of the semiconductor substrate 2 by photolithography as illustrated in FIG. 1Y. The gate pattern 21, sidewall spacers 24, 33, and 44 and the photoresist 47 are used as a mask to implant a deep-SD impurity into the epitaxial layer 41 in the PMOS region of the semiconductor substrate 2. For example, B (boron) ions may be implanted as the deep-SD impurity into the PMOS region of the semiconductor substrate 2.

The sidewall spacer 44 functions as an offset film for deep-SD impurity implantation into the PMOS region of the semiconductor substrate 2. If the step of forming the sidewall spacer 24 has been omitted, the gate pattern 21, sidewall spacers 33 and 44, and the photoresist 47 are used as a mask to implant the deep-SD impurity into the PMOS region of the semiconductor substrate 2.

If the PMOS region of the semiconductor substrate 2 has been doped in situ with B (boron) in the step of forming the epitaxial layer 41, the deep-SD impurity may not be implanted into the PMOS region of the semiconductor substrate 2 in addition. However, even if the PMOS region has been doped in situ with B (boron) in the step of forming the epitaxial layer 41, the PMOS region of the semiconductor substrate 2 may be further implanted with the deep-SD impurity in order to reduce bonding leakage or adjust bonding capacity.

An example in which multiple NMOS regions adjacent to each other are formed and an example in which multiple PMOS regions adjacent to each other are formed will be described. FIGS. 2A to 2D illustrate an example in which two adjacent NMOS regions are formed in a semiconductor substrate 2. FIGS. 3A to 3D illustrate an example in which two adjacent PMOS regions are formed in a semiconductor substrate 2.

Sidewall spacers 43 and 44 are formed by forming an insulating film 42 over the entire NMOS and PMOS regions of the semiconductor substrate 2 and applying overall anisotropic etch back to the insulating film 42 as described above. In the etching step for forming the sidewall spacers 43 and 44, the width of the insulating film remaining as the sidewall spacers depends on the gate pitch. The smaller the gate pitch is, the smaller the width of the sidewall spacer will be.

Figure 2A:
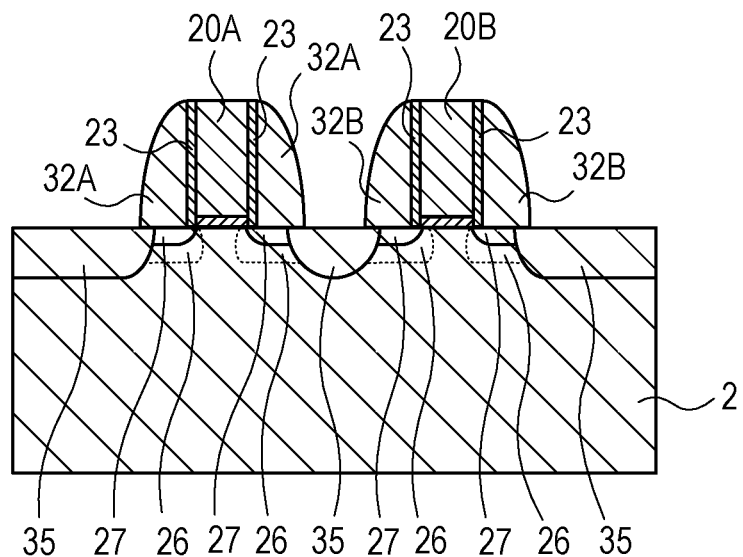
FIGS. 2A to 2D are cross-sectional views illustrating a process for fabricating a semiconductor device according to an embodiment in which NMOS regions are adjacent to each other.

If the pitch between gate patterns 20A and 20B is small as illustrated in FIG. 2A, the width of the sidewall spacer 43 formed between the gate patterns 20A and 20B may be small. The region between gate patterns 20A and 20B where the width of a sidewall spacer 43 formed between the gate patterns 20A and 20B will be small is herein referred to as a "narrow pitch region".

Figure 2B:
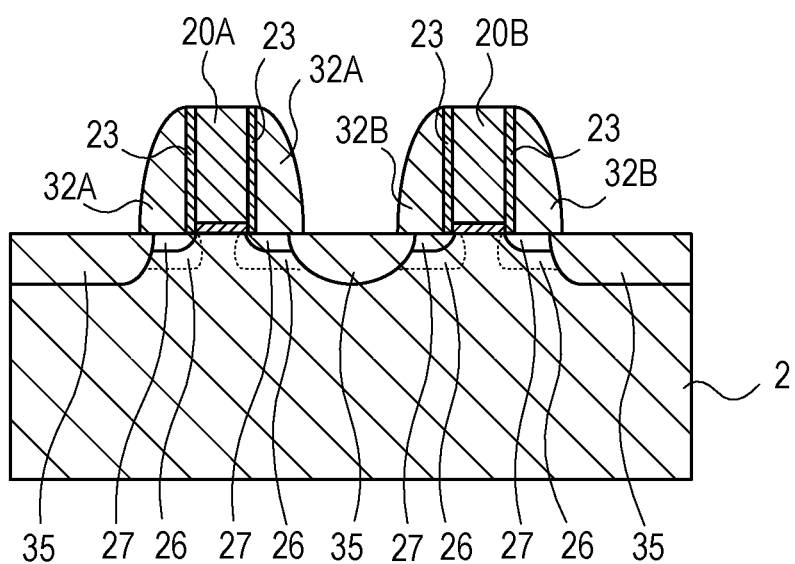

As illustrated in FIG. 2B, if the pitch between the gate patterns 20A and 20B is larger than the gate pitch illustrated in FIG. 2A, the width of the sidewall spacer 43 formed between the gate patterns 20A and 20B will not be small. The region between gate patterns 20A and 20B where the width of a sidewall spacer 43 formed between the gate patterns 20A and 20B is not small is herein referred to as a "wide pitch region".

In order to suppress the short-channel effect of a MOS transistor, it is important to set the width of the sidewall spacer 43 to a proper value. For example, if a deep-SD impurity is implanted into an NMOS region in a narrow pitch region of the semiconductor substrate 2 under the same conditions for deep-SD impurity implantation into an NMOS region in a wide pitch region of the semiconductor substrate 2, the short-channel characteristics will degrade because the width of the sidewall spacer 43 in the narrow pitch region is small.

Figure 2C:
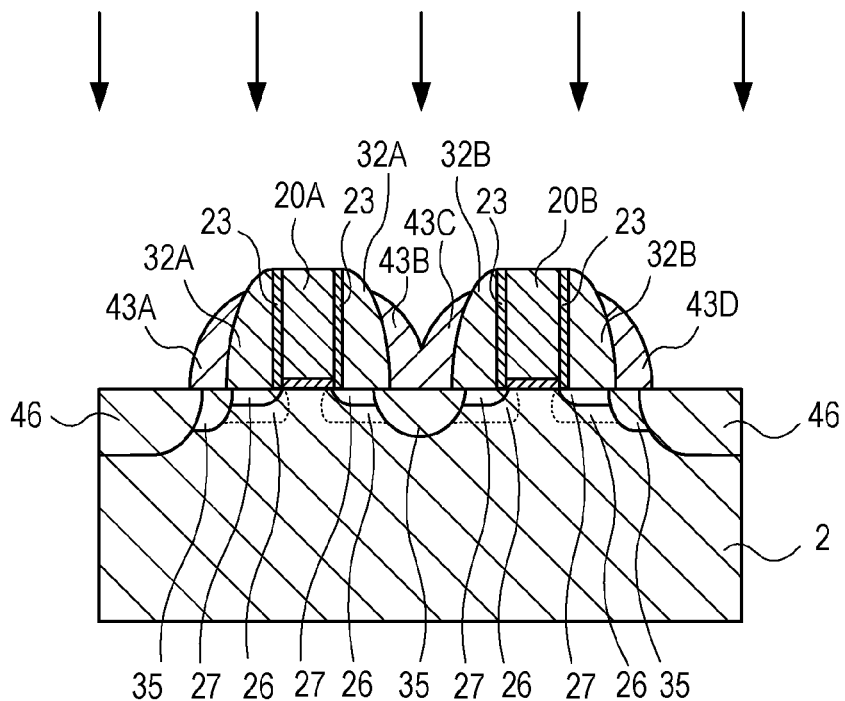

In the present embodiment, if the region between gate patterns 20A and 20B is a narrow pitch region as illustrated in FIG. 2C, sidewall spacers 43B and 43C in the narrow pitch region are formed in such a manner that sidewall spacers 43B and 43C are in contact with each other. By forming the sidewall spacers 43B and 43C in the narrow pitch region in contact with each other, deep-SD impurity implantation into the narrow pitch region of the semiconductor substrate 2 may be reduced. As a result, degradation of the short-channel characteristics may be reduced. Although the deep-SD region 46 is not formed in a region where a narrow-pitch gate pattern 20 is formed as illustrated in FIG. 2C, the resistance of the source-drain region may be reduced because a buffer region 35, which is an impurity diffusion region, is formed.

Thus, an NMOS region of the semiconductor substrate 2 where a deep-SD impurity is not implanted may be used for a circuit, for example an SRAM, for which the short-channel effect has higher priority than a driving current.

Figure 2D:
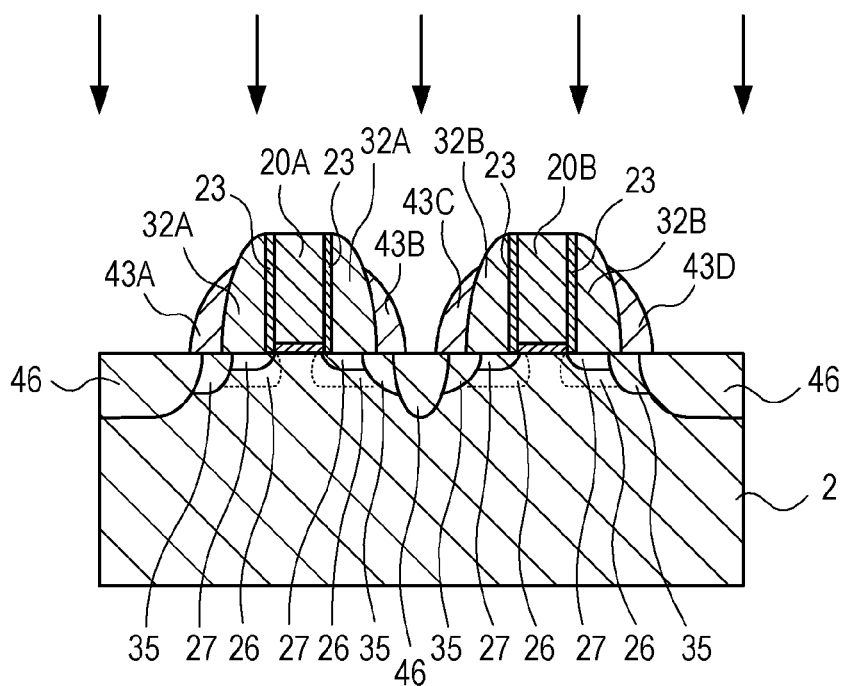

If the pitch between gate patterns 20A and 20B is large enough as illustrated in FIG. 2D, a deep-SD impurity may be implanted into the NMOS region of the semiconductor substrate 2 even if sidewall spacers 43B and 43C are formed.

Figure 3A:
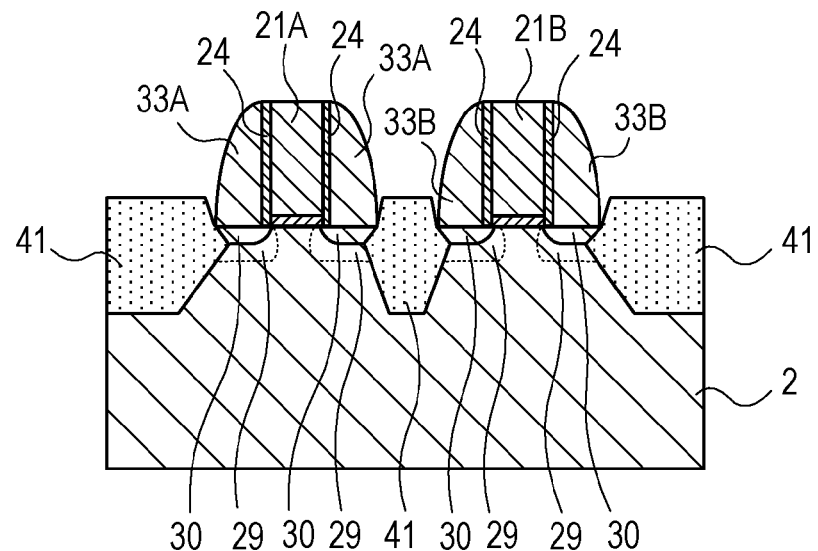
FIGS. 3A to 3D are cross-sectional views illustrating a process for fabricating a semiconductor device according to an embodiment in which NMOS regions are adjacent to each other.

If the pitch between gate patterns 21A and 21B is small as illustrated in FIG. 3A, the width of the sidewall spacer 44 formed between the gate patterns 21A and 21B will be small.

Figure 3B:
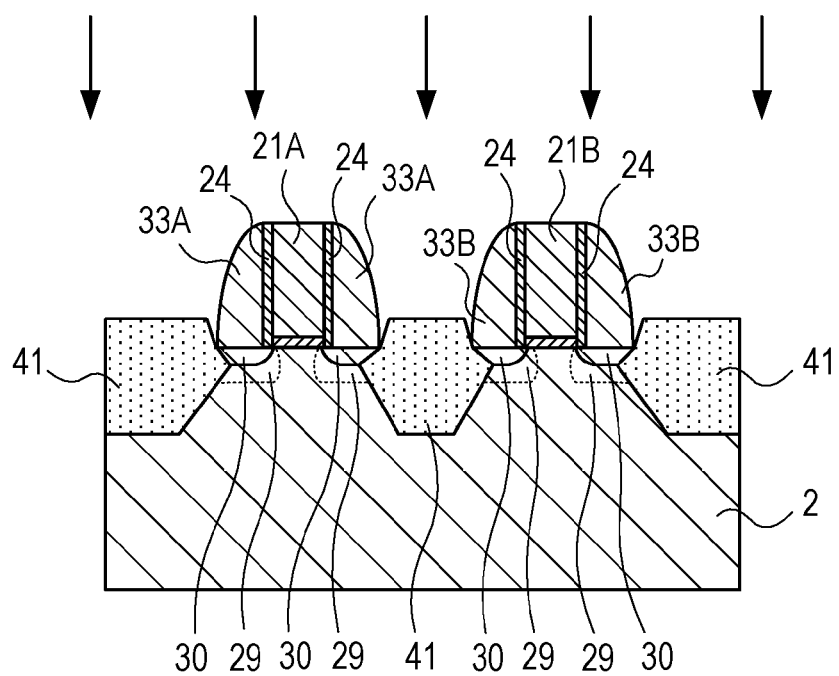

If the pitch between gate patterns 21A and 21B is large enough as illustrated in FIG. 3B, the width of the sidewall spacer 44 formed between the gate patterns 21A and 21B will not be small.

In order to reduce the short-channel effect, it is important to set the width of the sidewall spacer 44 to a proper value. For example, if a deep-SD impurity is implanted into a PMOS region of the semiconductor substrate 2 in a narrow pitch region under the same conditions for deep-SD impurity implantation into a PMOS region of the semiconductor substrate 2 in a wide pitch region, the short-channel characteristics will degrade because the width of the sidewall spacer 44 in the narrow pitch region is small.

Figure 3C:
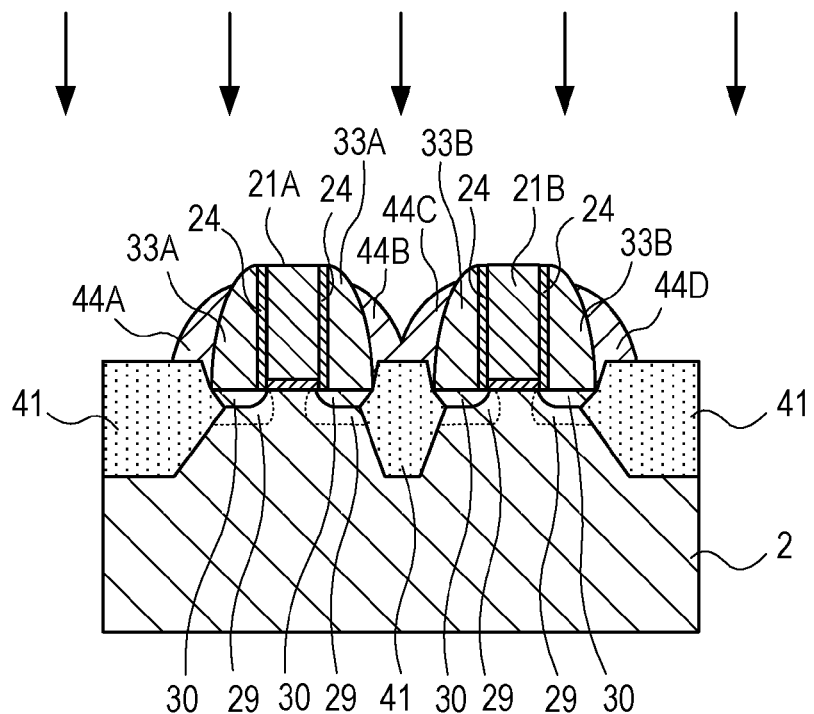

Therefore, if the pitch between gate patterns 21A and 21B is not large enough, sidewall spacers 43B and 44C are formed in contact with each other as illustrated in FIG. 3C in the present embodiment. That is, if the region between gate patterns 21A and 21B is a narrow pitch region, the sidewall spacers 44B and 44C in the narrow pitch region are formed in contact with each other. By forming the sidewall spacers 44B and 44C in the narrow pitch region so that the sidewall spacers 44B and 44C are in contact with each other, deep-SD impurity implantation into the narrow pitch region of the semiconductor substrate 2 may be reduced. As a result, degradation of the short-channel characteristics may be reduced.

Figure 3D:
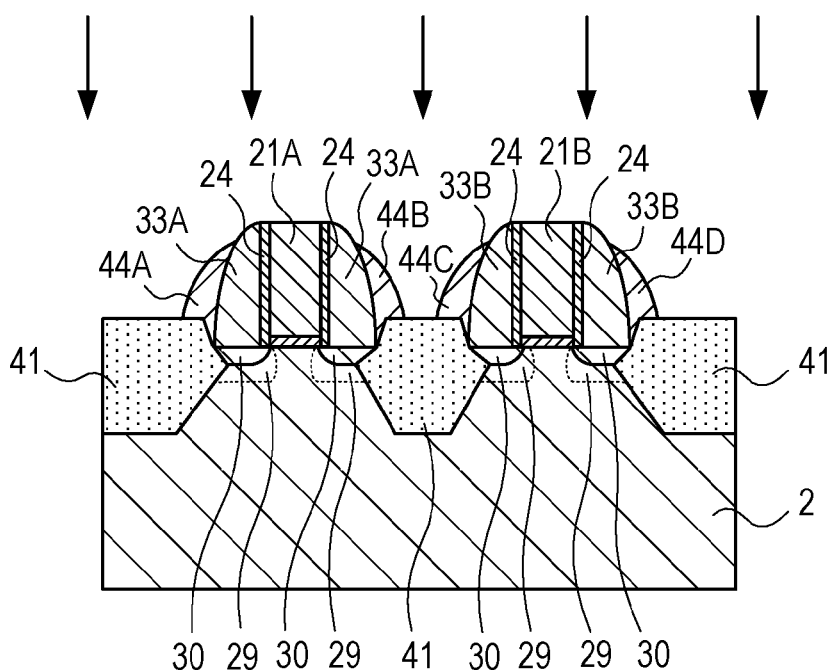

If the pitch between gate patterns 21A and 21B is large enough as illustrated in FIG. 3D, a deep-SD impurity may be implanted into the PMOS region of the semiconductor substrate 2 even if sidewall spacers 44A and 44B are formed.

Figure 4A:
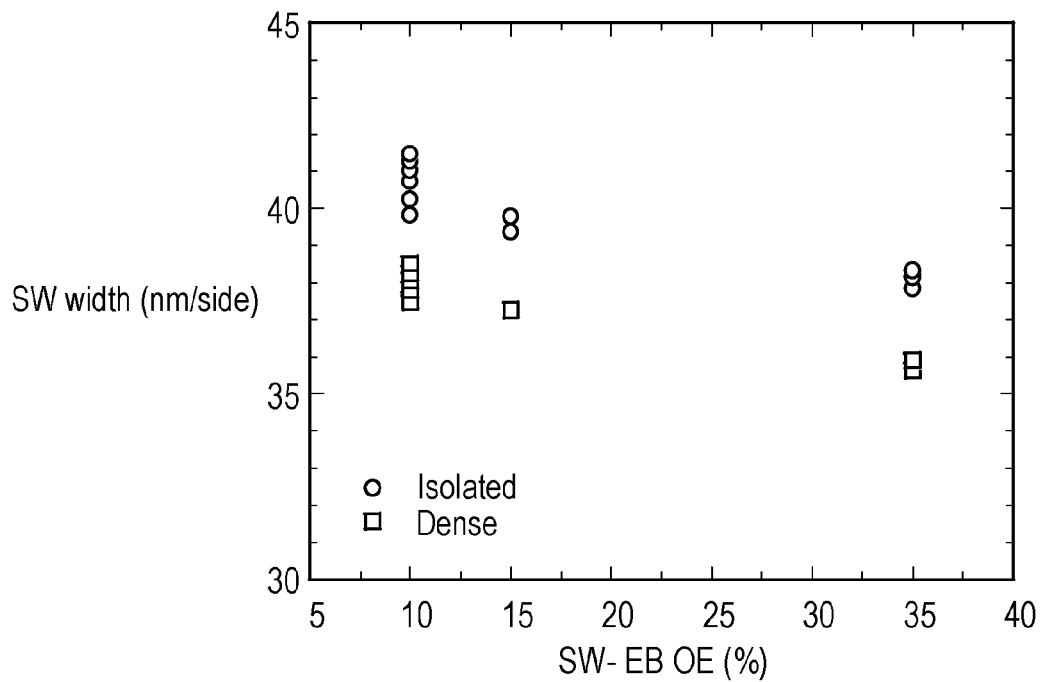
FIGS. 4A and 4B are graphs illustrating the relationship between the overetching rate (%) of insulating film etching and the resulting sidewall spacer width.

In FIG. 4A, horizontal axis shows overetching rate (%) of sidewall film 31, and vertical axis shows resulting width of sidewall spacers 32 and 33. In FIG. 4A, the symbol ○ represents data on a wide pitch region and □ represents data on a narrow pitch region. The sidewall films 31 in the wide and narrow pitch regions were etched under the same conditions.

As illustrated in FIG. 4A, under the same conditions, the resulting widths of the sidewall spacers 32 and 33 in the narrow pitch region is smaller than those of the sidewall spacers 32 and 33 in the wide pitch region.

Figure 4B:
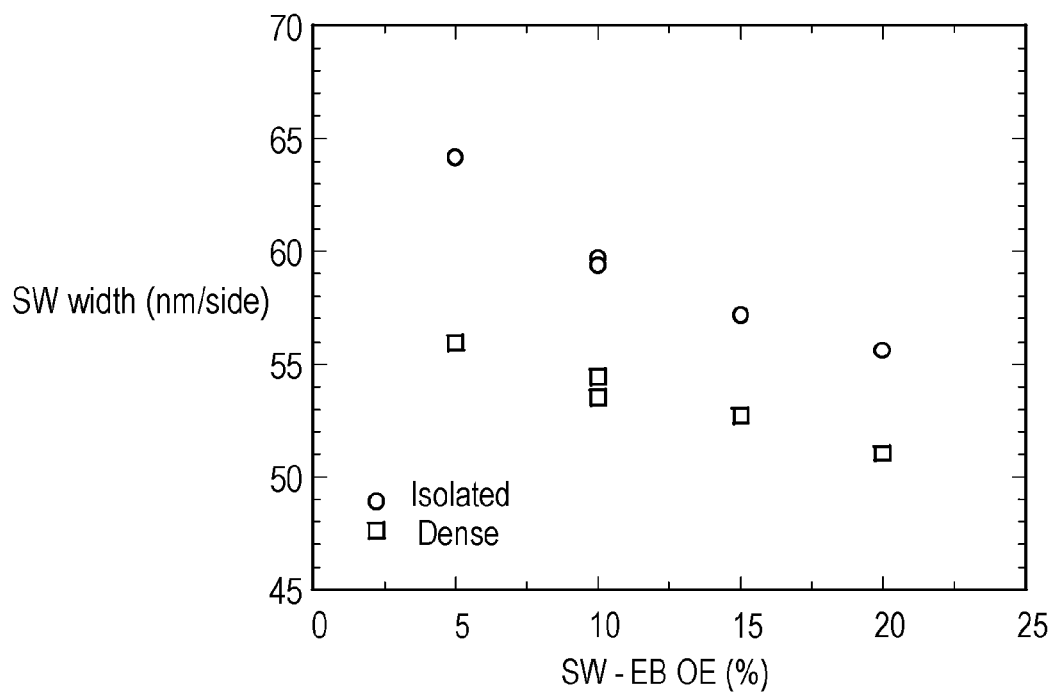

In FIG. 4B, horizontal axis shows overetching rate (%) of sidewall film 42, and vertical axis shows resulting width of sidewall spacers 43 and 44. In FIG. 4B, the symbol ○ represents data on a wide pitch region and □ represents data on a narrow pitch region. The sidewall films 42 in the wide and narrow pitch regions were etched under the same conditions.

As illustrated in FIG. 4B, under the same conditions, the resulting widths of the sidewall spacers 43 and 44 in the narrow pitch region is smaller than those of the sidewall spacers 43 and 44 in the wide pitch region.

FIGS. 5A to 5I illustrate a process for fabricating the semiconductor device continued from FIG. 1Y. The photoresist 47 formed over the NMOS region of the semiconductor substrate 2 is removed by ashing or a wet process using an agent such as SPM. Then spike annealing is applied to the semiconductor substrate 2 in order to activate the impurity implanted in the NMOS and PMOS regions of the semiconductor substrate 2. The spike annealing is performed at 1050° C., for example. In order to further activate the impurity implanted in the NMOS and PMOS regions of the semiconductor substrate 2 and to reduce abnormal diffusion of the impurity, flashlamp annealing or laser spike annealing may be applied at a temperature higher than or equal to 1150° C. for a millisecond time in addition.

Figure 5A:
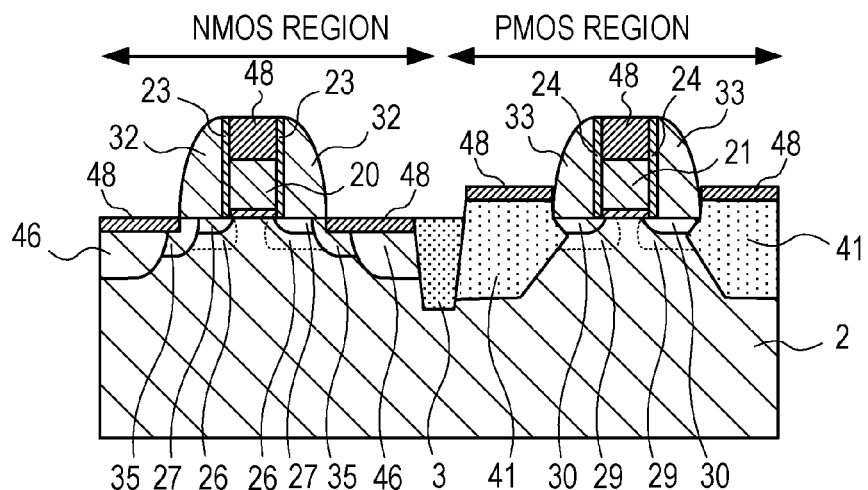
FIGS. 5A to 5I are cross-sectional views illustrating a process for fabricating a semiconductor device according to an embodiment.

The sidewall spacer 43 in the NMOS region of the semiconductor substrate 2, the sidewall spacer 44 in the PMOS region of the semiconductor substrate 2, and the native oxide film on the surface of the silicon substrate 2 are removed by a wet process using an HF solution. As illustrated in FIG. 5A, a silicide 48 such as $NiSi_x$ is formed over the gate patterns 20 and 21, the buffer region 35, the deep-SD region 46, and the epitaxial layer 41. Before forming the silicide 48, the sidewall spacers 43 and 44 are removed.

In order to increase the electron mobility in the NMOS, or as an etching stopper in formation of a contact hole, a tensile film 49 having a tensile stress is formed over the entire NMOS and PMOS regions of the semiconductor substrate 2. For example, SiN film may be deposited over the semiconductor substrate 2 by PECVD to a thickness in the range from 30 nm to 100 nm to form the tensile film 49.

Figure 5B:
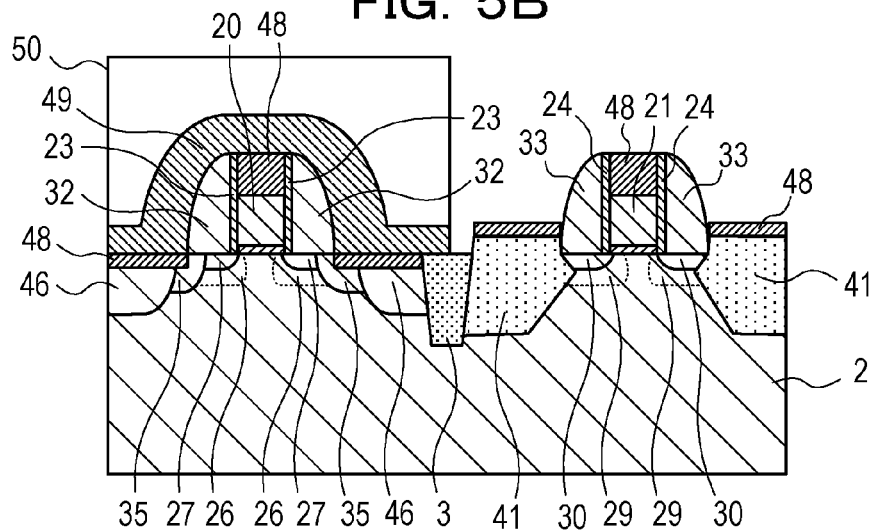

A photoresist 50 is formed over the NMOS region of the semiconductor substrate 2 by photolithography. As illustrated in FIG. 5B, the photoresist 50 is used as a mask to anisotropically etch the tensile film 49 in the PMOS region of the semiconductor substrate 2 by RIE to selectively remove the tensile film 49 from the PMOS region of the semiconductor substrate 2. The photoresist 50 may be selectively formed over multiple NMOS regions of the semiconductor substrate 2. With this, the tensile film 49 in the multiple NMOS regions of the semiconductor substrate 2 may be selectively removed.

The photoresist 50 formed over the NMOS region of the semiconductor substrate 2 is removed by ashing or a wet process using an agent such as SPM. In order to increase the hole mobility in the PMOS region, or as an etching stopper in formation of a contact hole, a compressive film 51 having a compressive stress is formed over the entire NMOS and PMOS regions of the semiconductor substrate 2. For example, SiN film may be deposited over the semiconductor substrate 2 by PECVD to a thickness in the range from 30 nm to 100 nm to form the compressive film 51.

Figure 5C:
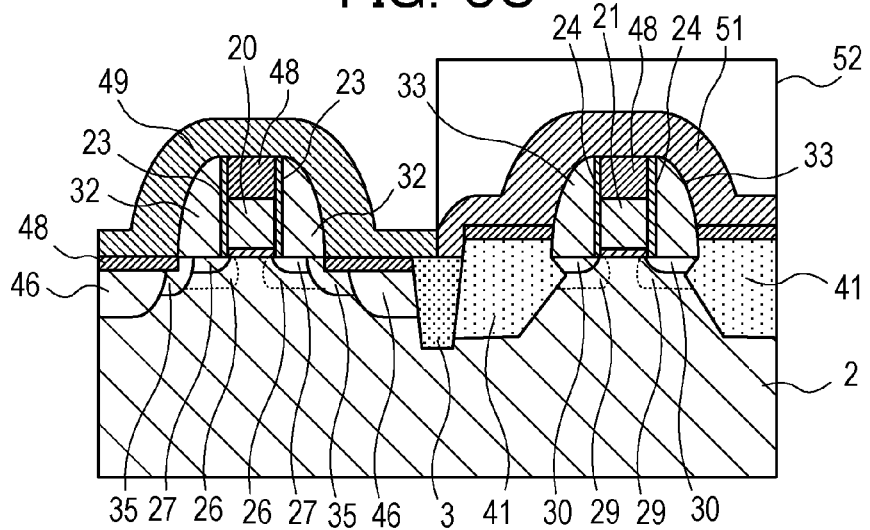

A photoresist 52 is formed over the PMOS region of the semiconductor substrate 2 by photolithography. As illustrated in FIG. 5C, the photoresist 52 is used as a mask to anisotropically etch the compressive film 51 in the NMOS region of the semiconductor substrate 2 by RIE to selectively remove the compressive film 51 from the NMOS region of the semiconductor substrate 2. The photoresist 52 may be selectively formed over multiple PMOS regions of the semiconductor substrate 2. With this, the compressive film 51 in the multiple PMOS regions of the semiconductor substrate 2 may be selectively removed.

Figure 5D:
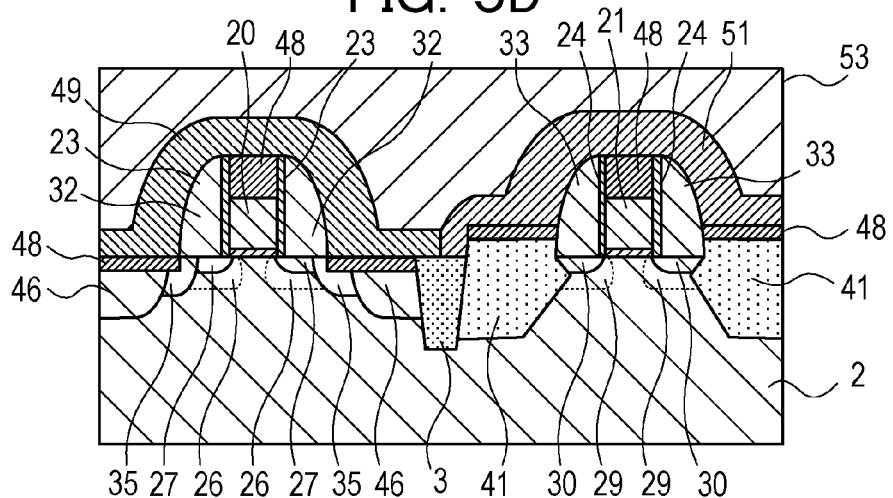

As illustrated in FIG. 5D, an interlayer insulating film 53 is formed over the tensile film 49 and the compressive film 51. For example, $SiO_2$ film may be deposited over the tensile film 49 and the compressive film 51 by CVD from TEOS to a thickness in the range from 0.5 μm to 0.7 μm to form the interlayer insulating film 53.

Figure 5E:
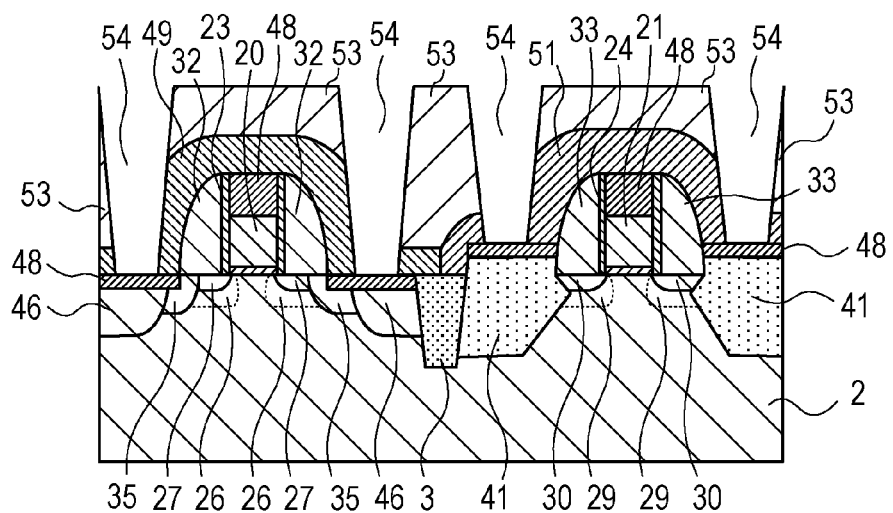

The interlayer insulating film 53 is planarized by CMP. A contact hole pattern is formed over the interlayer insulating film 53 by photolithography. As illustrated in FIG. 5E, the interlayer insulating film 53 is etched by RIE to form contact holes 54 in the interlayer insulating film 53.

Figure 5F:
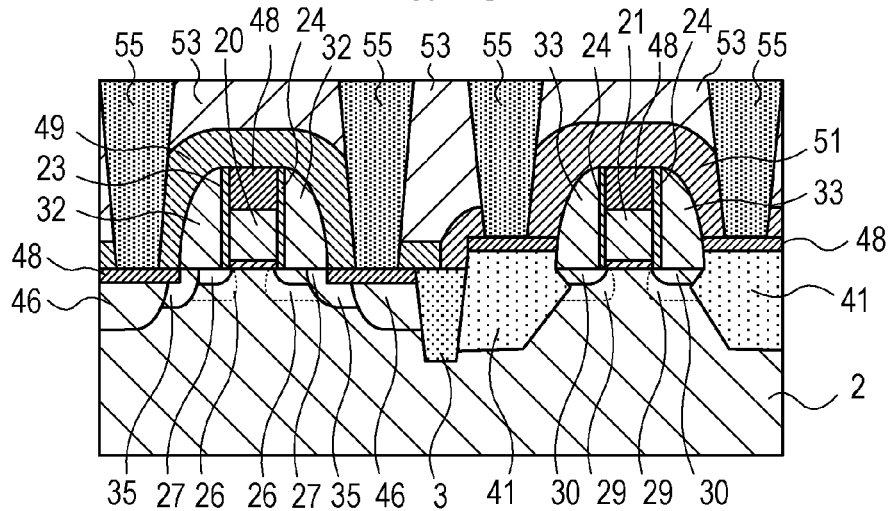

A diffusion barrier having a multilayer structure of TiN and Ti is formed in the contact holes 54. Then, the contact holes 54 are filled with W (tungsten) and W (tungsten) is deposited over the interlayer insulating film 53 by CVD, for example. The W over the interlayer insulating film 53 is polished by CMP. W is left only in the contact holes 54 to form W plugs 55 as illustrated in FIG. 5F.

Figure 5G:
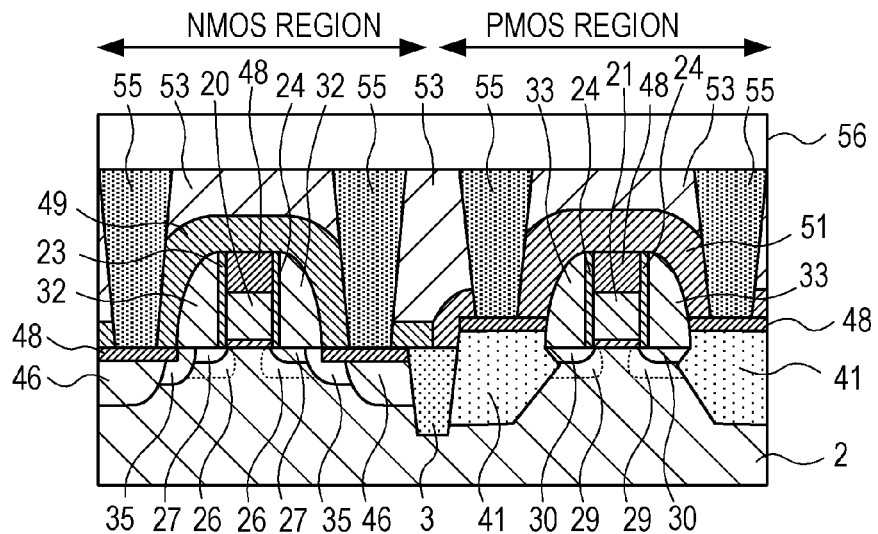

In order to form an interconnect trench for a first interconnect to be formed by a damascene process, a first interconnect interlayer insulating film 56 is formed over the interlayer insulating film 53 and the W plugs 55 as illustrated in FIG. 5G. The first interconnect interlayer insulating film 56 is an oxide film or a low-dielectric-constant insulating film, for example. A wiring pattern is formed over the first interconnect interlayer insulating film 56 by photolithography.

Figure 5H:
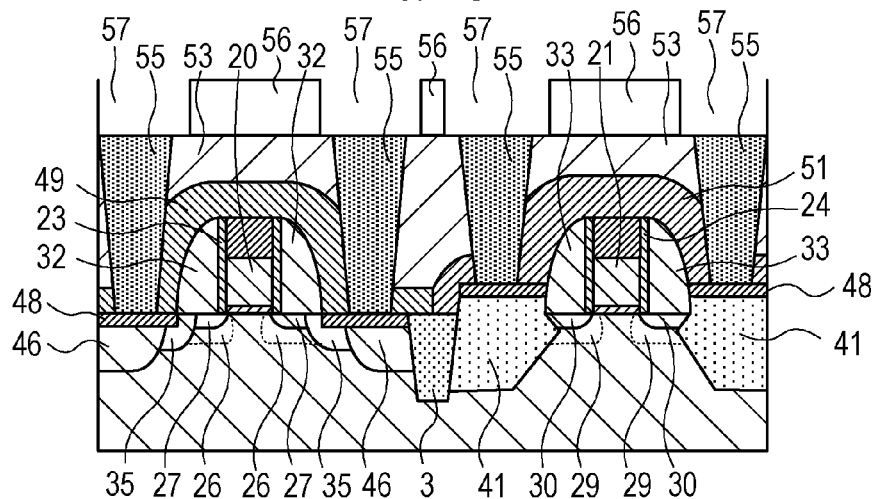

As illustrated in FIG. 5H, the wiring pattern formed over the first interconnect interlayer insulating film 56 is used as a mask to anisotropically etch the first interconnect interlayer insulating film 56 by RIE to form interconnect trenches 57.

Figure 5I:
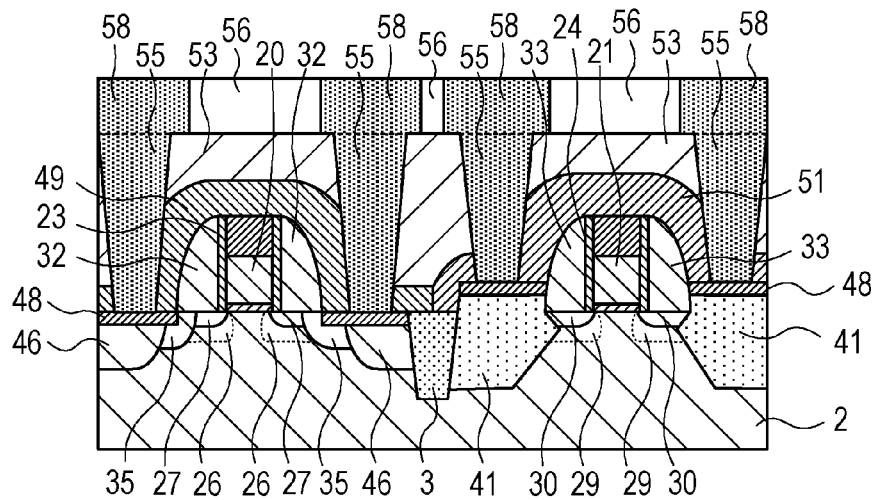

The interconnect trenches 57 are filled with a barrier metal and Cu (copper) and the barrier metal and Cu are deposited over the first interconnect interlayer insulating film 56. As illustrated in FIG. 5I, the barrier metal and Cu on the first interconnect interlayer insulating film 56 is polished by CMP to form a copper interconnect 58, which is a first interconnect.

For example, if the gate pitch of adjacent NMOS regions is in the range from 140 nm to 180 nm, the sidewall spacers 43 in the adjacent NMOS regions may be formed in contact with each other to reduce a deep-SD impurity from being implanted into the NMOS regions of the semiconductor substrate 2. In this case, the sidewall spacers 43 in the adjacent NMOS regions with a gate pitch in the range from 140 nm to 180 nm may be formed in contact with each other by controlling the conditions under which the sidewall film 42 is formed. This applies to adjacent PMOS transistors as well.

Whether the space between gate patterns in adjacent NMOS regions is to be filled or not is determined based on the gate pitch of the NMOS regions. However, in practice, the gate height is also related and therefore whether the space between gates in adjacent NMOS regions is to be filled or not may be determined by the aspect ratio (AR) of the gate height to gate pitch. For example, in a narrow pitch region with an aspect ratio of 0.4 or less, the widths of sidewalls may be designed so that the space between the gates of adjacent NMOS regions is filled. In a narrow pitch region with an aspect ratio greater than 0.4, the width of side walls may be designed so that the space between gates of the adjacent NMOS regions is not filled. This applies to adjacent PMOS transistors as well.

The present embodiments have been described with respect to an example in which an n-type impurity is implanted in the gate polysilicon 9 in NMOS regions. However, the step of implanting an n-type impurity in the gate polysilicon 9 in NMOS regions may be omitted because the n-type impurity has been implanted in the gate pattern 20 in the step of implanting the deep-SD impurity in the NMOS regions of the semiconductor substrate 2.

The present embodiments have been described with respect to an example in which a p-type impurity is implanted in the gate polysilicon 9 in PMOS regions. However, if the step of implanting a deep-SD impurity into the PMOS regions of the semiconductor substrate 2 is performed, the p-type impurity is also implanted in the gate pattern 21 and therefore the step of implanting the p-type impurity into the gate polysilicon 9 in the PMOS regions may be omitted.

The sidewall spacers 43 and 44 are removed after the impurity implanted in the semiconductor substrate 2 is activated by heat treatment in the present embodiments. The present invention is not limited to the present embodiments, the impurity implanted in the semiconductor substrate 2 may be activated by heat treatment after the sidewall spacers 43 and 44 are removed. Semiconductor devices and methods for fabricating the semiconductor devices according to the present embodiments include a semiconductor device having multilayer interconnections and a method for fabricating the semiconductor device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a first gate pattern and a second gate pattern adjacent to the first gate pattern over a semiconductor substrate;
    forming a first sidewall spacer on a sidewall of the first gate pattern and a second sidewall spacer on a sidewall of the second gate pattern;
    implanting a first impurity into the semiconductor substrate using the first gate pattern, the first sidewall spacer, the second gate pattern, and the second sidewall spacer as a mask;
    forming a first insulating film covering the first gate pattern, the first sidewall spacer, the second gate pattern, and the second sidewall spacer;
    etching the first insulating film to expose the semiconductor substrate and to form a third sidewall spacer on a side surface of the first sidewall spacer and a fourth sidewall spacer on a side surface of the second sidewall spacer in such a manner that the third sidewall spacer is in contact with the fourth sidewall spacer between the first gate pattern and second gate pattern;
    implanting a second impurity into the semiconductor substrate using the first gate pattern, the first sidewall spacer, the third sidewall spacer, the second gate pattern, the second sidewall spacer, and the fourth sidewall spacer as a mask to form a first region being deeper than a second region provided under a contact portion between the third sidewall spacer and the fourth sidewall spacer; and
    after the implantation of the second impurity, removing the third sidewall spacer and the fourth sidewall spacer.

2. The method according to claim 1, further comprising:
    before forming the first sidewall spacer and second sidewall spacer, implanting a third impurity into the semiconductor substrate using the first gate pattern and the second gate pattern as a mask.

3. The method according to claim 2, wherein the first impurity is implanted shallower than the second impurity implanted and deeper than the third impurity implanted.

4. The method according to claim 2, further comprising:
    after removing the third sidewall spacer and the fourth sidewall spacer, forming a silicide over a surface of the semiconductor substrate.

5. The method according to claim 1, wherein the contact portion between the third sidewall spacer and the fourth sidewall spacer does not have a flat portion.

* * * * *